(12) United States Patent
Okino et al.

(10) Patent No.: US 6,447,964 B2
(45) Date of Patent: Sep. 10, 2002

(54) CHARGED-PARTICLE-BEAM MICROLITHOGRAPHY METHODS INCLUDING CHIP-EXPOSURE SEQUENCES FOR REDUCING THERMALLY INDUCED LATERAL SHIFT OF EXPOSURE POSITION ON THE SUBSTRATE

(75) Inventors: Teruaki Okino, Kamakura; Tomoharu Fujiwara, Ageo; Noriyuki Hirayanagi, Tokyo, all of (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/795,258

(22) Filed: Feb. 27, 2001

(30) Foreign Application Priority Data

Mar. 1, 2000  (JP) .......................................... 2000-055583

(51) Int. Cl.[7] .............................. G03C 5/00; G03F 9/00
(52) U.S. Cl. ........................... 430/30; 430/296; 430/942
(58) Field of Search ........................... 430/30, 296, 942

(56) References Cited

U.S. PATENT DOCUMENTS

| 5,998,071 | A | * | 12/1999 | King et al. | 430/30 |
| 6,087,053 | A | * | 7/2000 | Hara | 430/30 |
| 6,103,433 | A | * | 8/2000 | Tolcada | 430/30 |
| 6,110,627 | A | * | 8/2000 | Nakasuji | 430/30 |
| 6,228,544 | B1 | * | 5/2001 | Ota | 430/30 |
| 6,238,830 | B1 | * | 5/2001 | Rangarajan et al. | 430/30 |

* cited by examiner

Primary Examiner—Christopher G. Young
(74) Attorney, Agent, or Firm—Klarquist Sparkman LLP

(57) ABSTRACT

Methods are disclosed for reducing effects of thermal expansion of a sensitive substrate arising during microlithographic exposure of the substrate using a charged particle beam. Thermal expansion ordinarily causes lateral shift of exposure position of dies (chips) on the substrate which tends to reduce the positional accuracy with which images of the dies are formed on the substrate. Generally, regions of the substrate where entire dies are formed are exposed first, followed by regions (especially peripheral regions) exposed with only portions of dies. In addition, the substrate can be mounted on a wafer chuck configured to circulate a heat-transfer gas in contact with the substrate to remove heat from the substrate. In addition, the wafer chuck can be maintained at a constant temperature by circulating a liquid coolant through a conduit in the body of the wafer chuck.

20 Claims, 19 Drawing Sheets

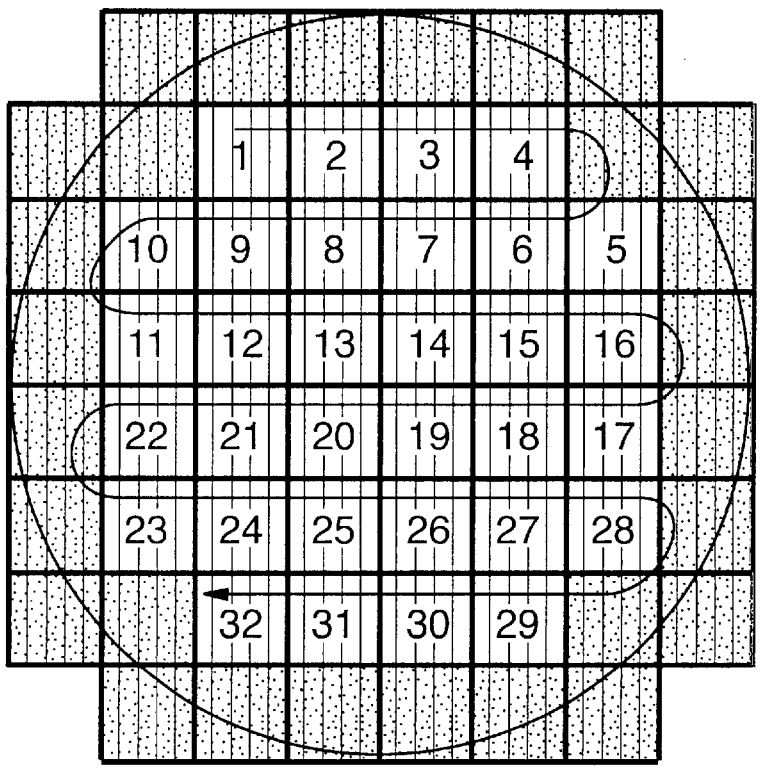
FIG. 1
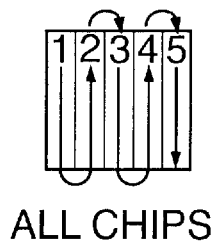
ALL CHIPS
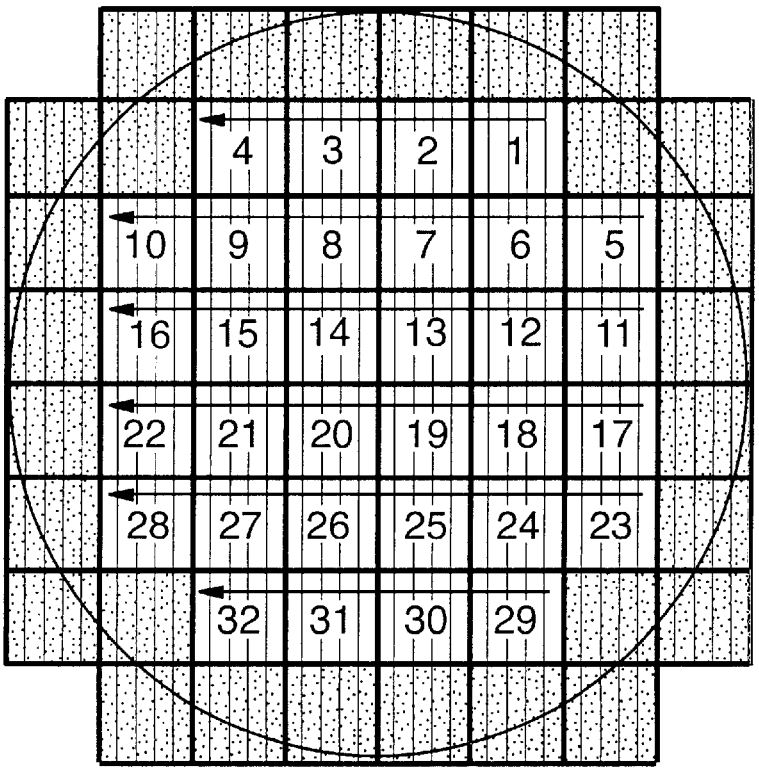
FIG. 2
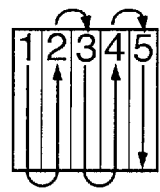
ALL CHIPS

CHIPS IN
"B"-SCANNED
ROWS

CHIPS IN
"A"-SCANNED
ROWS

ALL CHIPS

ALL CHIPS

ALL CHIPS

CHIPS 1-2, 7-12, AND 20-28

CHIPS 3-6, 13-19 AND 29-32

ALL CHIPS

CHIPS
1-8, 16-23,
AND 28-30

CHIPS
9-15, 23-27
AND 31-32

CHIPS
1-2, 7-10,
AND 21-24

CHIPS
6 AND 18-20

CHIPS
11-12 AND
25-28

CHIPS
3-5, 13-17
AND 29-32

CHIPS IN "A"-SCANNED ROWS

CHIPS IN "B"-SCANNED ROWS

CHIPS IN
"A"-SCANNED
ROWS

CHIPS IN
"B"-SCANNED
ROWS

ALL CHIPS

CHIP EXPOSURE SEQUENCE: RANDOM

STRIPE-EXPOSURE SEQUENCE:

(1)    a, b, c, d exposed or not done ↓ order of a, b, c, d exposure ↓ stripe-exposure sequence A-D selected for ▨ example:         ....

(2)

a-d selected in same manner as above
a-h added to a-d with weighting coefficient assigned
outside chips lightly weighted

CHIPS
1-4, 11-16
AND 23-28

CHIPS
5-10, 17-22
AND 39-32

ALL CHIPS

"A" CHIPS  "B" CHIPS
OR
"A" CHIPS  "B" CHIPS

ALL CHIPS

"A" CHIPS   "B" CHIPS
OR

"A" CHIPS   "B" CHIPS

ALL CHIPS

ALL CHIPS

CHARGED-PARTICLE-BEAM MICROLITHOGRAPHY METHODS INCLUDING CHIP-EXPOSURE SEQUENCES FOR REDUCING THERMALLY INDUCED LATERAL SHIFT OF EXPOSURE POSITION ON THE SUBSTRATE

FIELD OF THE INVENTION

This invention pertains to microlithography (projection-transfer of a pattern, defined by a reticle or mask, to a sensitive substrate). Microlithography is a key technology used in the manufacture of microelectronic devices such as integrated circuits, displays, micromachines, and the like. More specifically, the invention pertains to microlithography as performed using a charged particle beam (e.g., electron beam or ion beam) as an energy beam.

BACKGROUND OF THE INVENTION

Microlithography using a charged particle beam (e.g., electron beam or ion beam) offers prospects of better resolution compared to optical microlithography, for reasons similar to the reasons why electron microscopy yields better resolution than optical microscopy. Unfortunately, whereas much optical microlithography is performed using a scheme in which an entire die (chip) pattern, as defined by the reticle, is projection-transferred to a sensitive substrate in one "shot" of a light beam, such "one-shot" projection-transfer of an entire reticle pattern using charged-particle-beam (CPB) microlithography has not yet been realized. The reasons pertain mainly to the inability to fabricate a suitable reticle that can be exposed in one shot of a charged particle beam, and the inability to fabricate CPB lens systems sufficiently large to project an entire reticle pattern with adequate control of aberrations.

In view of the above, a favored conventional CPB microlithography approach is to divide the reticle into multiple exposure units usually termed "subfields." The subfields are exposed individually by respective "shots" of the beam, and images of the individual subfields are formed on the substrate in locations serving to "stitch" the images together to form an integral image of the entire pattern at a respective "die" or "chip" on the substrate.

Regarding the substrate, a "sensitive" substrate is coated on its upstream-facing surface with a suitable "resist," which is a substance that, when exposed to a charged particle beam carrying an image, responds to the exposure by forming a latent image. The substrate usually is sufficiently large to be exposed with multiple chips that usually are placed side-by-side on the substrate in a two-dimensional rectilinear array. The substrate usually is a semiconductor wafer (e.g., silicon wafer), but can be any of various other suitable materials and configurations. Herein, "substrate" and "wafer" are used interchangeably.

As noted above, the die pattern on the reticle typically is divided into a large number of subfields. The subfields are exposed in an ordered sequence. To such end, the subfields normally are arranged in hierarchical groups. The usual group structure involves "rows" and "stripes," wherein a row includes several subfields, and a stripe includes multiple parallel rows. During exposure, the subfields in each row, the rows in each stripe, and the stripes are exposed sequentially. Thus, each die is exposed. Across the wafer, the dies are exposed sequentially, normally in a raster manner.

Reference is made to FIG. 31 depicting an array of chips T (each having dimensions of, e.g., 25×25 mm) situated on a wafer W (having a diameter of, e.g., 200 mm). Each chip includes five stripes S each comprising multiple rows (not shown) of subfields. Each stripe S has a width (equal to the length of each of the constituent rows) substantially equal to the width over which the beam can be deflected laterally (e.g., 5 mm). Hence, in this example, each stripe has dimensions of 5×25 mm, representing an area that can be exposed by a single respective scanning motion of the wafer stage.

Development of the present invention began with consideration of a sequential scheme for exposing chips as shown in FIG. 31, in which the disposition of stripes is established so as to expose chips onto the wafer with minimal movement of the wafer stage, thereby improving throughput. Specifically, in FIG. 31, exposure of chips is performed in numerical order beginning with the upper left corner of the wafer W. Each chip has a unique number in FIG. 31. According to the exposure sequence, adjacent stripes are exposed wherever possible. Since the wafer W is round and each chip is rectilinear, it can be seen that some of the chips (notably the peripheral chips) are not located completely within the bounds of the wafer. Obviously, these peripheral chips cannot (and do not) become functional devices. Only the chips located entirely within the bounds of the wafer become "functional-device chips." Nevertheless, the peripheral chips are included in the numerical order in which the chips are exposed on the wafer.

To maximize throughput and resolution, exposure of a wafer W as shown in FIG. 31 is performed using an electron beam accelerated by a high voltage and having high beam current. Consequently, the electron-beam energy locally absorbed by the wafer W in the region of a chip currently undergoing exposure is high. For example, with a beam subjected to an acceleration voltage of 100 kV and having a beam current of 25 $\mu$A, the energy incident on the wafer is 2.5 W. This energy exceeds the incident energy otherwise applied in optical microlithography (using, e.g., a KrF excimer laser source) by a factor of 10 or more. At least about 80% of the incident energy is absorbed by the wafer and converted into heat, causing the wafer temperature to rise. Localized heating of the wafer causes the exposure positions on the wafer to shift laterally. Also, CPB microlithography is performed under sub-atmospheric pressure ("vacuum"). As a result, whereas some wafer heat is conducted to the wafer chuck, most of the wafer heat remains on the wafer, thereby accentuating the adverse effects of thermal expansion of the wafer.

SUMMARY OF THE INVENTION

In view of the shortcomings of the prior art, as summarized above, an object of the invention is to provide charged-particle-beam (CPB) microlithography methods exhibiting reduced net lateral shift of exposure position on the wafer caused by exposure-induced thermal expansion of the wafer.

To such end, and according to a first aspect of the invention, CPB microlithography methods are provided in which the sequence with which the wafer is exposed with chips (and with stripes in individual chips) is altered so as to reduce the net lateral shift of exposure position on the wafer caused by thermal expansion.

In combination with altering the exposure order, the wafer chuck can be provided with channels or the like through which a heat-transfer gas is conducted so as to contact the under-surface of the wafer as the wafer is being exposed. Hence, heat is better conducted away from the wafer during exposure.

In combination with any of the foregoing, the magnitude and direction of lateral shift of various regions of the wafer can be predicted in advance. This information can be used to apply deflectional corrections to the beam and/or positional corrections of the wafer stage to offset the lateral shift.

The foregoing aspects result in reduced deviations of exposure position caused by thermal expansion of the wafer, thereby increasing exposure accuracy and resolution.

The foregoing and additional features and advantages of the invention will be more readily understood from the following detailed description, which proceeds with reference to the accompanying drawings.

BRIEF DESCRIPTION OF THE DRAWINGS

FIG. 1 is a plan view showing a sequence scheme for exposing chips on a wafer and stripes within each chip, according to Example Embodiment 1.

FIG. 2 is a plan view showing a sequence scheme for exposing chips on a wafer and stripes within each chip, according to Example Embodiment 2.

DETAILED DESCRIPTION

General Considerations

This invention is discussed below in the context of using an electron beam as a microlithographic energy beam. It will be understood that the principles of the invention can be applied with equal facility to use of an alternative charged particle beam, such as an ion beam.

Figure 26:
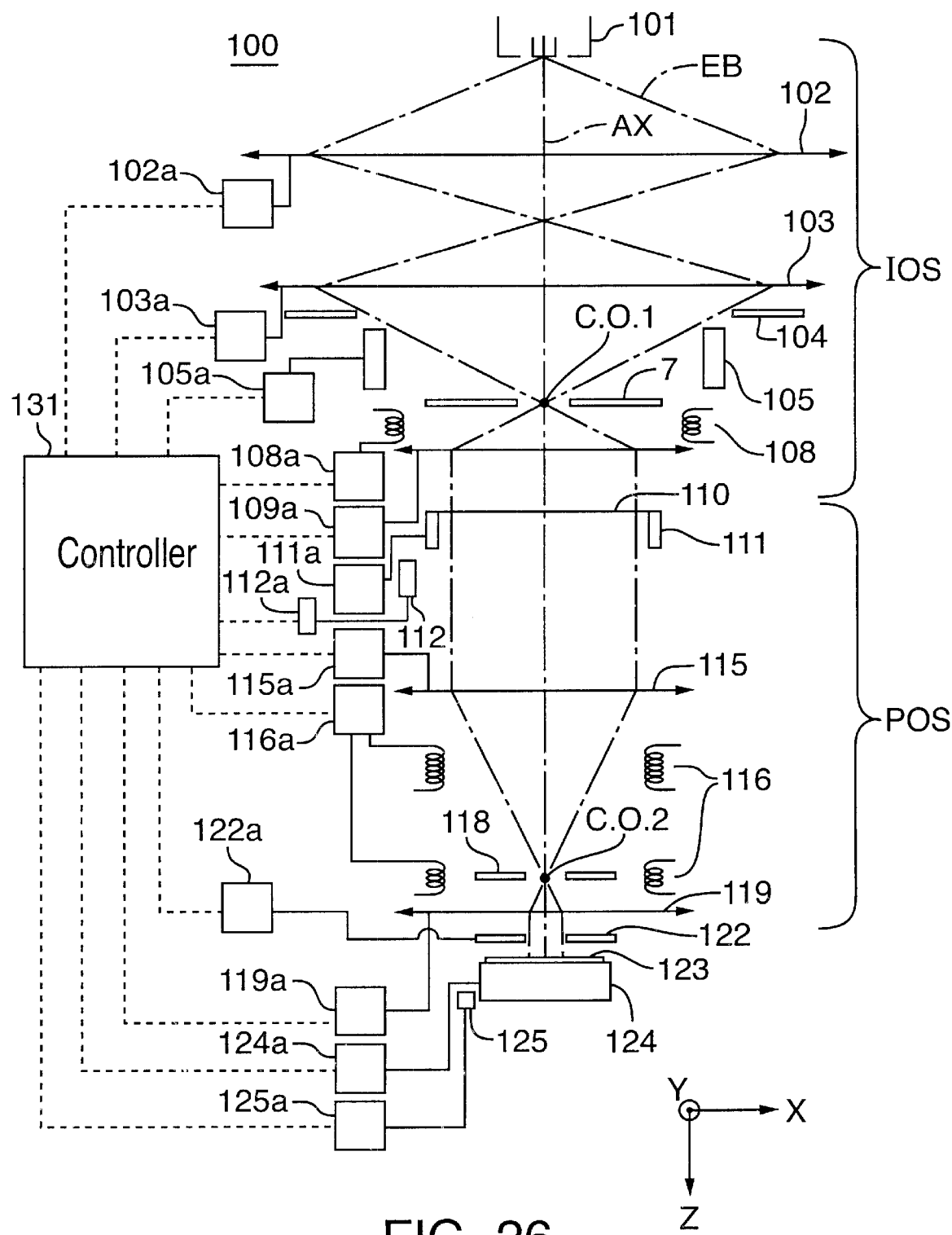
FIG. 26 is a schematic elevational diagram of a charged-particle-beam microlithography apparatus with which an exposure method according to the invention can be used.

General aspects of an electron-beam microlithography apparatus 100 are depicted in FIG. 26. The apparatus 100 shown in FIG. 26 is configured especially for projection-transfer of a pattern, defined by a "divided" or "segmented" reticle, with demagnification onto a suitable substrate (e.g., semiconductor wafer). FIG. 26 also depicts certain imaging and control relationships of the apparatus.

An electron gun 101, situated at the extreme upstream end of the apparatus 100, serves as a source of an electron beam EB that propagates from the electron gun 101 in a downstream direction along an optical axis Ax. Downstream of the electron gun 101 are an illumination-optical system IOS and a projection-optical system POS. The illumination-optical system IOS is situated between the electron gun 101 and the reticle 110, and the projection-optical system POS is situated between the reticle 110 and the substrate (wafer) 123. The electron beam EB passing through the illumination-optical system IOS is termed the "illumination beam," and the beam passing through the projection-optical system POS is termed the "patterned beam."

The illumination-optical system IOS comprises a first condenser lens 102, a second condenser lens 103, a beam-shaping aperture 104, a blanking aperture 107, and an illumination lens 109. The condenser lenses 102, 103 converge the illumination beam to form a crossover C.O.1 at the blanking aperture 107.

The beam-shaping aperture 104 defines an opening that trims the illumination beam to a desired transverse profile, usually sufficient to illuminate a single subfield or other exposure unit on the reticle 110. Hence, the opening in the beam-shaping aperture 104 normally is square or rectangular in shape. For example, the opening can be sufficient to illuminate a square subfield, on the reticle, measuring from 0.5 mm to 5 mm on each side. An image of the opening in the beam-shaping aperture 104 is formed on the reticle 110 by the illumination lens 109 located downstream of an illumination-beam deflector 108.

Situated downstream of the beam-shaping aperture is a blanking deflector 105. The blanking deflector 105 deflects the illumination beam sufficiently to cause the beam to strike, during "blanking," the opaque portion of the blanking aperture 107. Thus, the illumination beam is prevented from striking the reticle 110. Situated downstream of the blanking aperture 107 is the illumination-beam deflector 108. The illumination-beam deflector 108 scans the illumination beam, primarily in the X-direction (horizontally in FIG. 26), to illuminate the reticle subfields that lie within the optical field of the illumination-optical system IOS. The subfields are illuminated in a serial manner.

Although, in FIG. 26, the reticle 110 is shown having only one subfield (situated at the optical axis Ax), an actual reticle 110 would have a large number of subfields extending outward in a plane (X-Y plane) perpendicular to the optical axis Ax. The reticle 110 defines the entire pattern of the respective layer to be applied to a die (chip) on the substrate 123.

The reticle is mounted on a reticle stage 111 that is movable within the X-Y plane. Thus, each of the subfields of the reticle 110 extending beyond the optical field of the illumination-optical system IOS can be illuminated. Installed on the reticle stage 111 is a position sensor 112. The position sensor 112 employs a laser interferometer to provide accurate real-time data on the position of the reticle stage 111.

The projection-optical system POS comprises a first projection lens 115, a second projection lens 119, and an image-position deflector 116. A respective image acquired by the patterned beam upon passage of the beam through a subfield of the reticle 110 is formed by the projection-optical system POS in the prescribed location on the substrate 123. So as to be imprintable with the image, the substrate 123 is coated with an appropriate resist that is sensitive to exposure by electrons in the patterned beam. The projection lenses 115, 119 collectively have a demagnification ratio according to which the projection lenses 115, 119 form a demagnified image of the illuminated region of the reticle 110 on the substrate 123.

A crossover C.O.2 is formed on the optical axis Ax at a point that divides the axial distance between the reticle 110 and the substrate 123 into segments having respective axial lengths proportional to the demagnification ratio. A contrast aperture 118 is situated at the crossover C.O.2. The contrast aperture 118 blocks any electrons of the patterned beam that were scattered by non-patterned portions of the reticle 110, thereby preventing the scattered electrons from reaching the substrate 123.

Situated just upstream of the substrate 123 is a backscattered-electron (BSE) detector 122. The BSE detector 122 detects electrons backscattered from a mark provided on an unexposed surface of the substrate 123, or on the wafer stage 124. A mark on the substrate 123, for example, can be scanned by a beam that has passed through a suitable mark pattern on the reticle 110. The relative positions of the reticle 110 and substrate 123 can be determined by detecting electrons backscattered from the mark on the substrate 123.

The substrate 123 is mounted via an electrostatic chuck (not shown) on the wafer stage 124. The subfields in the pattern, arranged in rows and stripes extending beyond the optical field of the illumination-optical system, are scanned by controlled movements of the wafer stage 124 to permit the subfields to be exposed in a sequential manner. During such scanning, the reticle stage 111 and wafer stage 124 are moved synchronously in opposite directions. The wafer stage 124 includes a position sensor 125 that is similar in configuration and operation to the position sensor 112, as described above, for the reticle stage 111.

Each of the lenses 102, 103, 109, 115, 119 and deflectors 105, 108, 116 has a respective controlled power supply 102a, 103a, 109a, 115a, 119a, 105a, 108a, 116a, respectively. The power supplies are connected to and controlled by a controller 131. Similarly, the reticle stage 111 and wafer stage 124 have respective stage drivers 111a, 124a. The stage drivers 111a, 124a are connected to and controlled by position data routed to the controller 131 via respective interfaces 112a, 125a. Each interface 112a, 125a includes an amplifier and an analog-to-digital (A/D) converter. The BSE detector routes signals to the controller 131 through a respective interface 122a.

The controller 131 determines errors in stage-position control, and corrects these errors by energizing the image-position deflector 116 in an appropriate manner. Thus, a reduced image of the illuminated reticle subfield can be transferred accurately to a target location on the substrate 123. On the substrate 123, the respective subfield images are stitched together in a contiguous manner to achieve transfer of an entire chip pattern from the reticle to the substrate.

Figure 27A:
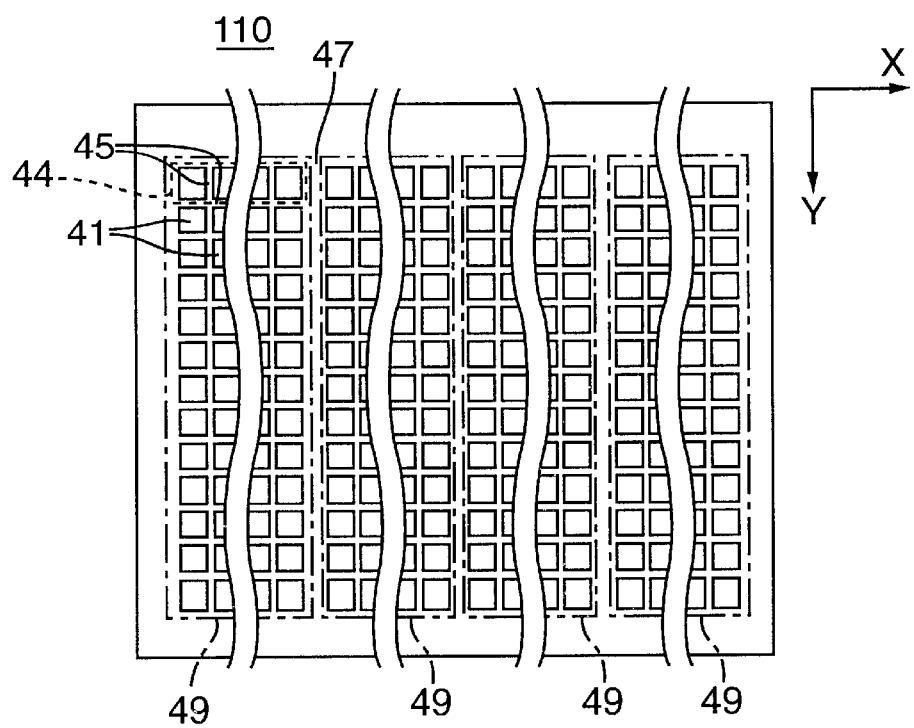
FIG. 27(A) is a schematic plan view of a segmented reticle usable with the apparatus of FIG. 26.
Figure 27B:
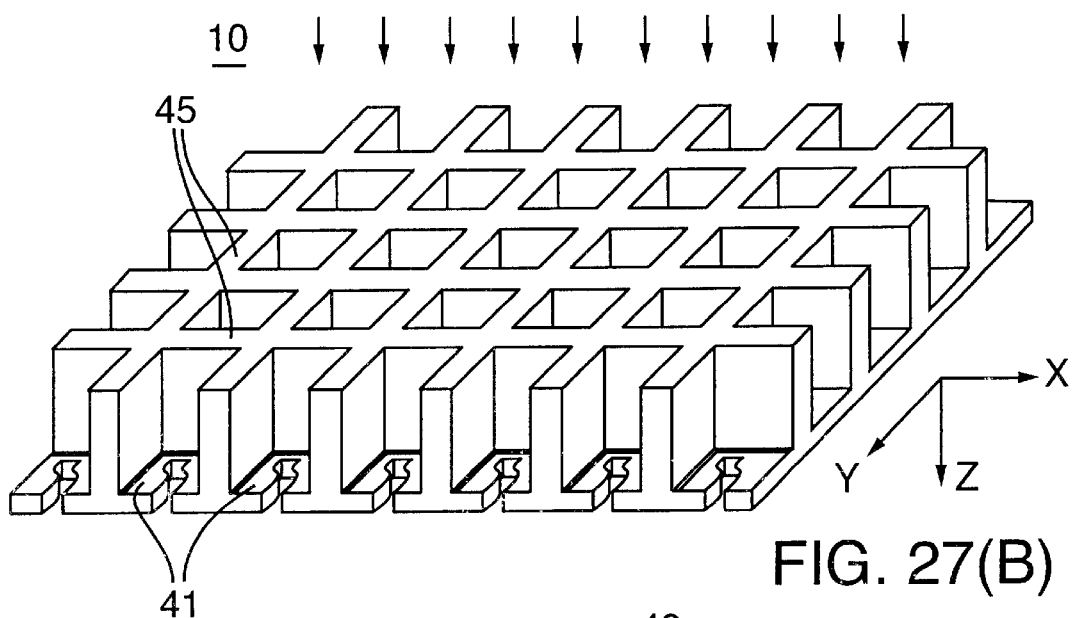
FIG. 27(B) is an oblique view of certain details of a region of the reticle of FIG. 27(A).
Figure 27C:
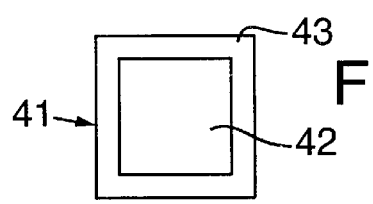
FIG. 27(C) is a plan view of a subfield of the reticle of FIG. 27(A).

Details of a representative divided reticle 110 are shown in FIGS. 27(A)–27(C). FIG. 27(A) is a schematic plan view of the reticle; FIG. 27(B) is a schematic oblique view of a portion of the reticle; and FIG. 27(C) is a schematic plan view showing a single subfield. The depicted reticle 110 can be fabricated, for example, by electron-beam drawing and subsequent etching of a silicon wafer. The reticle 110 is "divided" or "segmented" by which is meant that the pattern defined by the reticle is divided into multiple "subfields" each defining a respective portion of the pattern. In each subfield, the respective pattern portion is defined on or by a respective portion of the reticle membrane. The pattern can be defined in the manner of a "stencil" reticle, in which through-openings are defined in the membrane to define the respective pattern elements. Alternatively, the pattern can be defined in the manner of a "membrane" reticle, in which respective pattern elements are defined by corresponding regions of a highly scattering material (i.e., highly scattering to the electron beam) situated on the membrane.

Referring to FIG. 27(A), the individual regions denoted by the numeral 41 are respective membrane regions (0.1 $\mu$m to several $\mu$m thick) corresponding to individual respective subfields. As shown in FIG. 27(C), a typical membrane region 41 comprises a centrally located subfield 42 surrounded by a non-patterned peripheral "skirt" 43. The subfield 42 defines the respective pattern portion. The skirt 43 is a region, surrounding the subfield 42, in which the edges of the illumination beam are incident.

Typically, a single subfield 42 has a size of 0.5-mm square to 5-mm square on the reticle 110. At a demagnification ratio of 1/5, for example, the corresponding size of an image of a subfield 42 as projected onto the wafer 123 is 0.1-mm square to 1-mm square.

Returning to FIG. 27(A), the individual membrane regions 41 are separated from one another by struts 45 that collectively form an orthogonal grid across the reticle 1. Each strut 45 typically is 0.5 mm to 1 mm thick (in the Z-direction) and approximately 0.1 mm wide (in the X- or Y-direction). The grid formed by the interconnecting struts 45 provides substantial rigidity and mechanical strength to the array of membrane regions 41 constituting the reticle 110. The skirts 43 typically are approximately 0.05 mm wide.

As shown in FIG. 27(A), linear groups of multiple membrane regions 41 are arrayed in the X-direction in the figure to form "deflection strips" or "rows" 44. Multiple deflection strips 44 are arrayed in the Y-direction in the figure to form a "stripe" 49. The reticle 110 comprises multiple stripes 49 arrayed in the X-direction. The width of each stripe 49 (equal to the length of each deflection strip 44 in the major stripe) corresponds to the deflection range of the illumination-optical system IOS. The stripes 49 are separated from one another by large struts 47 that help minimize overall distortion of the reticle 110. The large struts 47 are contiguous with the smaller struts 45 and are each about 0.5 mm to 1 mm thick and several mm wide.

Although the reticle 110 shown in FIG. 27(A) has non-patterned regions (i.e., skirts 43 and struts 45) situated between each subfield 42, certain configurations of divided reticles lack non-patterned regions between the subfields 42 located within individual deflection strips 44.

Typically, the subfields 42 in a single deflection strip 44 are illuminated sequentially for exposure, wherein sequential illumination is achieved by appropriately deflecting the illumination beam laterally (in the X-direction in FIG. 27(A)) in a continuously scanning manner. The deflection strips in a stripe 49 are illuminated sequentially by appropriately moving the reticle stage 111 in a continuously scanning manner (in the Y-direction in FIG. 2(A)). To advance to the next stripe 49, the reticle stage 111 is moved intermittently ("stepped") as required.

During projection of the subfields 42, any intervening non-patterned regions such as skirts and struts are not imaged on the wafer 123. Meanwhile, the images of the subfields are placed contiguously on the wafer 123 to achieve proper "stitching" of the images for forming "chips" on the wafer.

Figure 28:
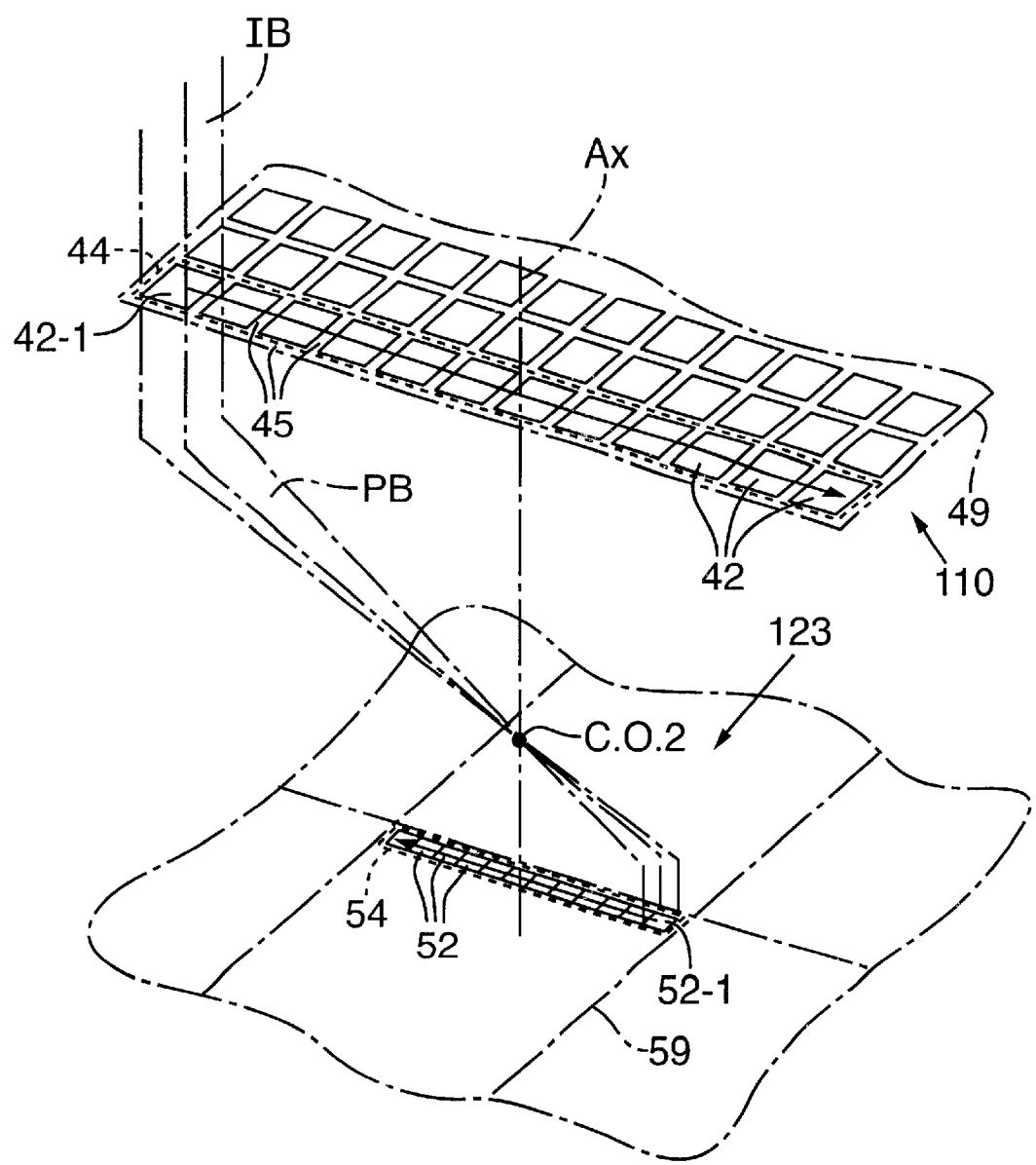
FIG. 28 is a schematic oblique view showing certain details of a microlithographic exposure performed using the reticle of FIG. 27(A).

FIG. 28 shows certain aspects of a representative manner in which the subfields 42 are projected from the reticle 110 to the wafer 123. A portion of a stripe 49 on the reticle 110 is shown in the upper portion of the figure. The stripe 49 comprises multiple deflection strips 44 each containing a linear array of subfields 42 (skirts and struts are not shown). In the figure, the subfield 42-1 in the upper left corner of the stripe 49 is being illuminated from upstream by the illumination beam IB. The patterned beam PB that has passed through the subfield 42-1 passes through a crossover position C.O.2. The image carried by the patterned beam PB is demagnified and projected by the action of the projection lenses 115, 119 (not shown, but see FIG. 26) onto a corresponding transfer subfield 52-1 on the wafer 123.

As can be seen, each deflection strip 44 on the reticle 110 is transferred to a corresponding row 54 on the wafer 123. However, the transfer subfields 52 in the deflection strip are not separated from one another by struts. I.e., the subfields in the row 54 are contiguous. Similarly, the multiple rows 54 in a transferred stripe 59 on the wafer 123 are contiguous with each other.

Between the reticle 110 and the wafer 123, the patterned beam PB is bent twice by the projection lenses 115, 119. The first deflection is from a direction parallel to the optical axis to an oblique direction that crosses the optical axis Ax. The second deflection is essentially opposite the first deflection.

The respective transfer position, on the wafer 123, of each transfer subfield 52 is determined by appropriate energization of the image-position deflector 116 situated between the reticle 110 and the wafer 123 to achieve proper stitching together of the transfer subfields 52. If the patterned beam PB propagating from a particular subfield 42 were focused merely on the wafer 123 by the projection lenses 115, 119, then the image of the entire subfield 42 (including struts 45 and skirt 43) would be transferred, at the specified demagnification ratio, to the wafer 123, producing unexposed regions on the wafer 123. To avoid this situation, the transfer position of each transfer subfield 52 on the wafer 123 is shifted (laterally in the X- and Y-directions) as required for proper stitching. The respective magnitudes of the shifts correspond to the respective widths of the individual non-patterned regions. Of course, if the membrane regions 41 in individual deflection strips 44 are not separated by struts 45 and skirts 43, then such lateral shifting in the X-direction is not necessary. Similarly, if the deflection strips 44 in individual stripes 49 are not separated by struts 45 and skirts 43, then such lateral shifting in the X-direction is not necessary. Similarly, if the deflection strips 44 in individual stripes 49 are not separated by struts 45 and skirts 43, then such lateral shifting in the Y-direction is not necessary.

To achieve the performance as described above, the image-position deflector 116 comprises coil components for deflection in the X-direction and other coil components for deflection in the Y-direction.

If thermal expansion of the wafer 123 is predicted during exposure, then the magnitude of the expansion is predicted and exposure performed with the exposure position (on the wafer 123) corrected by an amount corresponding to the predicted thermal expansion. This prediction is performed by the controller 131 (FIG. 26), which delivers appropriate corrective signals to the image-position deflectors 116.

Figure 29:
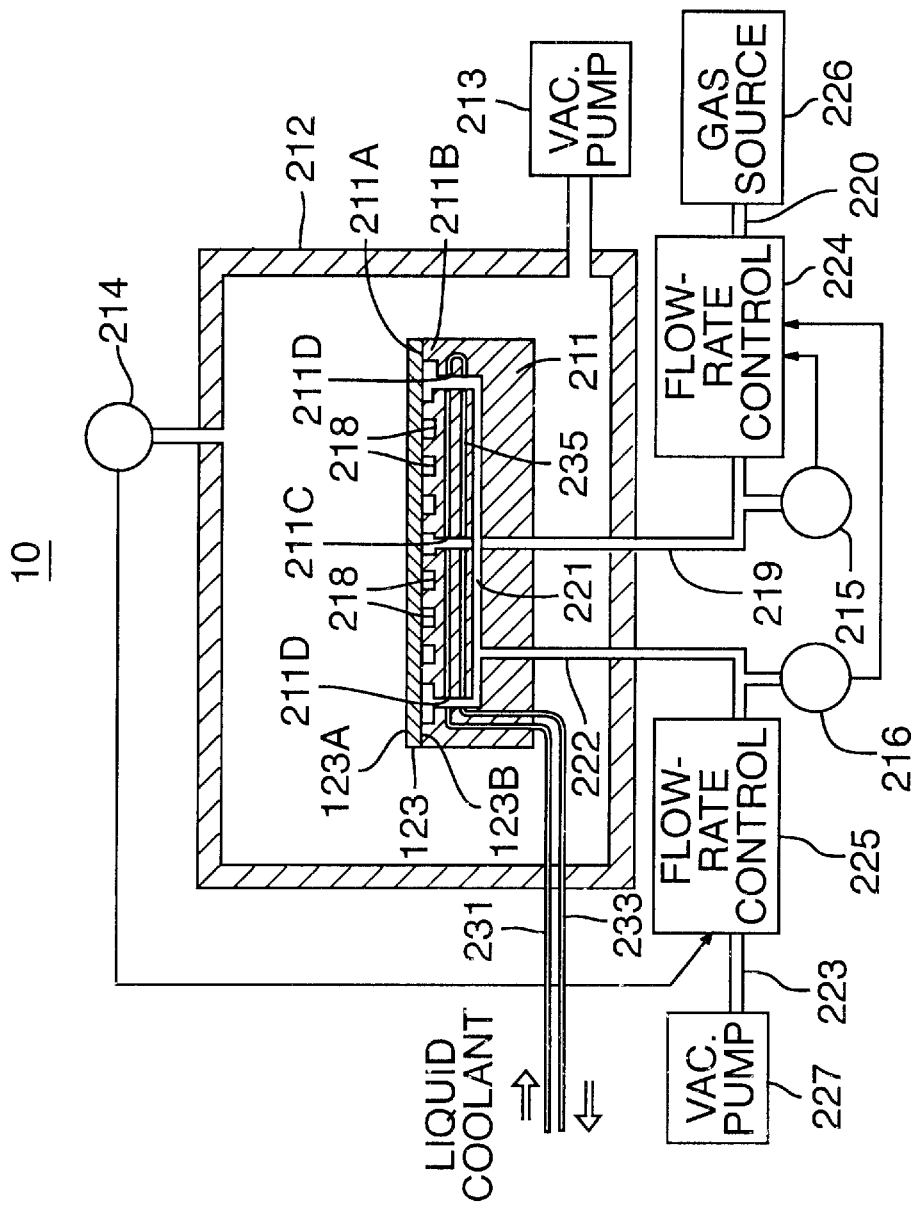
FIG. 29 is a schematic, partial-section view of the wafer stage and control components associated therewith, as used in the apparatus of FIG. 26.

As noted above, the wafer 123 is mounted on a wafer chuck, which is mounted on the wafer stage 124. As shown in FIG. 29, the wafer stage 124, wafer chuck 211, and wafer 123 are enclosed within a vacuum chamber 212, as shown in FIG. 29. The "underside" 123A of the wafer 123 is held on the wafer chuck 211 by a vacuum applied via the upper surface 211A of the wafer chuck 211. The "upper" surface 123A of the wafer 123 is coated with a suitable resist to as to be imprinted with the reticle pattern, as described above. The vacuum chamber 212 is evacuated using a suitable vacuum pump 213 (desirably a turbomolecular pump), which maintains the interior of the vacuum chamber 212 at a high vacuum (approximately $1.3 \times 10^{-3}$ Pa). The obtained vacuum level in the vacuum chamber 212 can be ascertained and monitored using a vacuum gauge 214 connected to the vacuum chamber 212. The reading obtained by the vacuum gauge 214 is fed back to a flow-rate controller 225, described later below.

The upper surface (i.e., the "chucking surface") 211A of the vacuum chuck 211 defines channels 218. The channels 218 extend over the chucking surface 211A except for peripheral portions (sealing regions) 211B of the chucking surface 211A. The channels 218 are used to conduct a heat-transfer gas such as helium that thus contacts the underside of the wafer 123 and conducts heat away from the wafer. The peripheral portions 211B serve to suppress leakage of the heat-transfer gas from the channels 218 into the interior of the vacuum chamber 212. The heat-transfer gas enters the channels 218 through a gas-inlet port 211C that extends vertically through the center of the wafer chuck 211 toward the chucking surface 211A. The gas-inlet port 211C is connected to a gas-inlet conduit 219 that conducts the heat-transfer gas into the channels 218.

Parameters determining the thermal conductance between the wafer chuck 211 and the wafer 123 include the thermal conductivity, pressure, and flow rate of the heat-transfer gas flowing through the channels 218, the transverse geometry and dimensions of the channels 218, and the like.

Under low-pressure conditions of the heat-transfer gas in the channels 218, the numerical density of the atoms of heat-transfer gas in the channels 218 is low. This results in a correspondingly longer mean free path of the atoms of heat-transfer gas (i.e., the mean distance traveled by the atoms in a straight-line trajectory). If the gas pressure is sufficiently low, then the mean free path can be considerably longer than a transverse dimension of the passages 218. In such a case, the thermal conductivity of the heat-transfer gas in the channels 218 is approximately proportional to the pressure of the gas.

On the other hand, under conditions in which the pressure of heat-transfer gas in the channels 218 is relatively high, the numerical density of the atoms of heat-transfer gas in the channels 218 is large, and the mean free path is correspondingly shorter. Under such conditions, the mean free path can be substantially shorter than a transverse dimension of a channel 218, wherein the thermal conductivity of the heat-transfer gas in the channels 218 is essentially constant and does not depend substantially on the gas pressure.

The distal end of the gas-inlet conduit 219 is connected to a flow-rate controller 224. The flow-rate controller 224 is connected to a gas source 226 (serving as a source of heat-transfer gas, such as helium) via a conduit 220. A vacuum gauge 215 is connected to the gas-inlet conduit 219 for monitoring the pressure in the gas-inlet conduit 219. Pressure data from the vacuum gauge 215 is fed back to the flow-rate controller 224. Hence, the flow-rate controller 224 regulates the flow rate of the heat-transfer gas through the gas-inlet conduit 219. Further details of this regulation are described later below.

Multiple gas-evacuation ports 211D extend from the chucking surface 211A through the thickness dimension of the wafer chuck 211. The gas-evacuation ports 211D are situated in the peripheral portions 211B of the wafer chuck 211. The gas-evacuation ports 211D are connected to a first gas-evacuation conduit 221, which is connected to a second gas-evacuation conduit 222. Heat-transfer gas that has passed through the channels 218 is evacuated by passage through the gas-evacuation conduits 221, 222. The second gas-evacuation conduit 222 is connected to a flow-rate controller 225. The flow-rate controller 225 is connected to a vacuum pump 227 via a conduit 223. The flow rate of heat-transfer gas through the gas-evacuation conduits 221, 222 is controlled by the flow-rate controller 225. Further details of this regulation are described later below.

A vacuum gauge 216 is connected to the second gas-evacuation conduit 222 for monitoring the pressure inside the gas-evacuation conduits 221, 222. Data from the vacuum gauge 216 are fed back to the flow-rate controller 224.

In the depicted embodiment, the pressure inside the channels 218 of the wafer chuck 211 is estimated on the basis of the data produced by the vacuum gauges 215, 216. Whereas such an estimate also can be made based on data from the vacuum gauge 215 alone, more accurate monitoring of the pressure in the channels 218 is achieved by also taking into consideration the data obtained by the other vacuum gauge 216.

Attention now is directed to the nature of the regulation performed by the flow-rate controllers 224, 225. If the quality of the under-surface 123B of the wafer 123 is good, then leakage of heat-transfer gas from the channels 218 of the wafer chuck 211 into the interior of the vacuum chamber 212 can be suppressed adequately by the peripheral portions 211 B of the wafer chuck 211. In this instance, the leakage rate of heat-transfer gas can be accommodated by the vacuum capacity of the vacuum pump 213, allowing the interior of the vacuum chamber 212 to be maintained at high vacuum (approximately $1.3 \times 10^{-3}$ Pa) using the vacuum pump 213 alone.

In instances in which the quality of the under-surface 123B of the wafer 123 is good such that the wafer is attached, via suction, properly to the chucking surface 211A, the flow-rate controller 224 effectively controls the flow rate of heat-transfer gas through the gas-inlet conduit 219. Also, the flow-rate controller 225 effectively controls the flow rate of spent heat-transfer gas through the gas-evacuation conduits 221, 222. As a result, the pressure inside the channels 218 is maintained at a target value (e.g., $2.7 \times 10^2$ Pa to $1.3 \times 10^3$ Pa, or 2 Torr to 10 Torr, respectively). With such control of gas flow rates, good thermal conductivity is established between the wafer chuck 211 and the wafer 123, and thermal expansion of the wafer is suppressed to prevent wafer deformation.

In contrast, if the condition of the under-surface 123B of the wafer 123 is poor, then the rate at which heat-transfer gas leaks from the peripheral portions 211B of the wafer chuck 211 is increased. In such cases, the magnitude of gas leakage can exceed the pumping capacity of the vacuum pump 213, and can result in a failure to establish and/or maintain the proper vacuum level inside the vacuum chamber 212. In such instances, the flow-rate controller 225 adjusts the flow rate of heat-transfer gas through the gas-evacuation conduits 221, 222 in a manner such that the inside of the vacuum chamber 212 is returned to the desired high vacuum (approximately $1.3 \times 10^{-3}$ Pa). This is achieved by increasing the rate at which the heat-transfer gas is evacuated from the channels 218, which counteracts and thus suppresses the leakage of gas into the vacuum chamber 212.

By increasing the rate at which heat-transfer gas is evacuated from the channels 218, the pressure inside the channels 218 drops below a target threshold to achieve a sufficient conductivity in the gas-evacuation channels 221, 222. If the condition of the under-surface 123B of the wafer 123 is poor, then the flow-rate controller 224 adjusts the flow rate of the heat-transfer gas through the gas-inlet conduit 219 so that conduction of heat between the wafer chuck 211 and the wafer 123 is maintained within a permissible range. Even if establishment of such control experiences a time lag, there is sufficient margin for returning the pressure inside the channels 218 to the target value. Hence, a deleterious effect on the thermal conductivity between the wafer chuck 211 and the wafer 123 is prevented.

By way of example, consider a situation in which (a) the heat-transfer gas is helium; (b) the Z-dimension of each of the channels 218 is 100 μm; (c) the mean free path of helium atoms is 100 μm; (d) the ambient temperature in the vicinity of the wafer chuck 211 is 300° K.; and (e) the helium pressure in the channels 218 is approximately $2.7 \times 10^2$ Pa (2 Torr) whenever the channels 218 are filled with He gas. If the under-surface 123B of the wafer 123 is poor in quality, then the flow-rate controller 224 desirably controls the flow rate of the He gas through the gas-inlet conduit 219 to achieve a He pressure in the channels 218 of approximately $1.3 \times 10^3$ Pa (10 Torr).

The wafer chuck 211 also includes a liquid-cooling circuit, comprising a coolant-inlet conduit 231, a coolant-outlet conduit 233, and coolant-circulation loop 235 defined within the thickness dimension of the wafer chuck 211 "beneath" the channels 218. An appropriate refrigerant (e.g., a Freon®) is circulated through the conduits 231, 233, 235. The liquid-cooling circuit maintains the wafer chuck 211 at an essentially constant temperature, which enhances the performance of the heat-transfer-gas system described above.

By including a heat-transfer gas system and a liquid-cooling circuit, the wafer chuck 211 can remove a substantial amount of heat from the wafer 123 during exposure of the wafer. However, despite these cooling systems, the wafer 123 still experiences some localized heating simply by absorbing energy from the incident patterned beam. Not all this heat is removed by the wafer chuck 211. Finite-element analysis indicates that this localized heating of the wafer 123 causes thermal expansion of the wafer, which changes the wafer dimensions slightly. These dimensional changes can affect, in an adverse manner, the accuracy with which a pattern can be transferred to a die on the wafer, and the accuracy with which multiple dies are exposed onto the wafer, as well as overlay accuracy.

The analysis also indicates that, within a single wafer 123, areas that are exposed later tend to show greater deformation.

Because an array of rectilinear chips (e.g., square or rectangular) is itself rectilinear and a wafer normally is round, exposing multiple rectilinear chips on a round wafer inevitably results in some chips being formed incompletely on the wafer surface. I.e., the chips exposed around the periphery of the wafer tend to "hang off" the edge of the wafer. These peripheral chips are termed "fragmentary chips." Fragmentary chips never become "functional-device chips" (chips residing completely on the wafer) simply because they inherently are incomplete and thus not fully functional. As a result, the accuracy with which fragmentary chips are exposed can be substantially poorer than the accuracy with which actual functional-device chips are exposed. E.g., fragmentary chips need not be exposed with highly accurate shot positions and overlay accuracy. The example embodiments described below are directed to various different "shot-order" schemes by which multiple dies on a wafer can be exposed so as to reduce the thermally induced dimensional changes to the wafer.

Example Embodiment 1 (Fragmentary Chips Later)

A chip-exposure sequence according to this example embodiment is shown in FIG. 1, in which areas of the wafer exposed with functional-device chips are exposed first, whereas areas of the wafer exposed with fragmentary chips are exposed last. Such a scheme improves the shot-position accuracy for functional-device chips.

In FIG. 1, the wafer outline "W" is shown. Fragmentary chips "T" are indicated by shading. Note that the fragmentary chips are located around the periphery of the wafer W. In the depicted wafer W, thirty-two functional-device chips (not shaded) can be formed. As can be seen, none of the functional-device chips "hang over" an edge of the wafer W. Rather, they are located entirely within respective regions of the wafer.

For each chip, the pattern is defined on a segmented reticle including multiple stripes. Exposure of each chip involves sequential exposure of the constituent stripes. An exemplary chip is shown in the lower portion of FIG. 1. The chip includes five stripes (oriented vertically in the drawing) that are exposed in the indicated order. The serpentine arrow indicates respective movements of the wafer stage to expose the stripes of each chip.

The functional-device chips are exposed in the indicated numerical order in this embodiment. This requires that the directions of respective movements of the reticle and wafer are reversed after each row of functional-device chips is exposed.

In addition, in this embodiment and as described generally above, a heat-transfer gas is circulated through channels in the wafer chuck 211 and a liquid coolant is circulated through the coolant-circulation loop 235 of the wafer chuck during exposure of the wafer. The heat-transfer gas is helium, which flows through the channels 218 at a pressure of several Torr. As a result, accumulated heat in the wafer is transferred readily to the wafer chuck 211.

By a combination of active cooling of the wafer chuck 211, circulating a heat-transfer gas through the channels 218 during exposure, and altering the shot order as noted above, a very high shot-positional accuracy is obtained for each functional-device chip.

Figure 31:
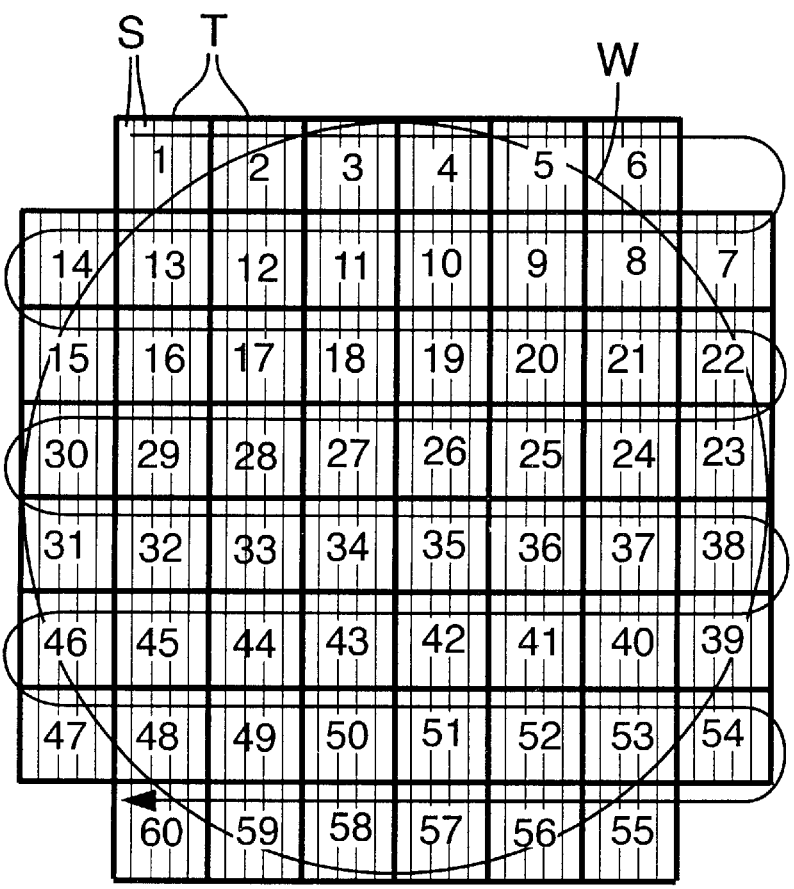
FIG. 31 is a plan view showing a sequence scheme for exposing chips on a wafer and stripes within each chip.
Figure 31:
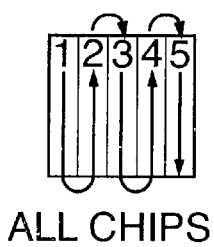

Further with respect to the finite-element analysis, if the exposure sensitivity of the resist on the wafer is 10 $\mu C/cm^2$, then the maximum shot-positional error of the conventional exposure scheme shown in FIG. 31 is approximately 150 nm. In contrast, with the exposure scheme of this example embodiment, the maximum shot-positional error (excluding the fragmentary chips) is reduced to approximately 40 nm, which is less than one-third of the conventional error.

Example Embodiment 2 (Chips and Stripes in Opposite Directions)

This example embodiment is shown in FIG. 2. As in Example Embodiment 1, the fragmentary chips are exposed last. Each chip includes five stripes that are exposed from left to right as indicated in the lower portion of the figure. The same stripe-exposure sequence is used for all the functional-device chips on the wafer. The functional-device chips are exposed in the indicated numerical order. In this embodiment, in contrast to the first example embodiment, all the functional-device chips are exposed from right to left. Using such a scheme, the forces of thermal expansion of the wafer mutually cancel each other out, thereby reducing the shot-positional error of the functional-device chips.

The phrase "mutually cancel the forces of thermal expansion of the wafer" is explained with reference to chip 2. Specifically, chip 2 is exposed beginning with the left-hand stripe. During their respective exposures, the stripes further to the right in chip 2 tend to be displaced toward the right due to thermal expansion. However, chip 2 is displaced to the left to begin with due to thermal expansion during exposure of chip 1. Accordingly, regarding the stripes located farther to the right in chip 2, the thermal expansion that occurred during exposure of the previously exposed chip 1 is offset by the thermal expansion occurring during exposure of the currently exposed chip 2. Because the displacements in chip 2 are offset by the displacements in chip 1, wherein the respective displacements are in mutually opposite directions, the displacements cancel each other.

Importantly, in this embodiment, the direction of chip exposure on the wafer and the direction of stripe exposure within each chip are opposite to each other. Of course, the same effect can be obtained if the left and right directions were reversed from those shown in FIG. 2.

Combining the stripe and chip exposure scheme of this example embodiment with use of a liquid-cooled wafer chuck in which a heat-transfer gas is circulated, as described above, yields a further improvement in shot-position accuracy. Specifically, using finite-element analysis, with a resist sensitivity of 5 $\mu C/cm^2$, the maximum shot-position error of the scheme of Example Embodiment 1 is approximately 10 nm. Using the scheme in Example Embodiment 2, the shot-position error is reduced by approximately 30%, resulting in a maximum shot-position error of approximately 7 nm.

Figure 3:
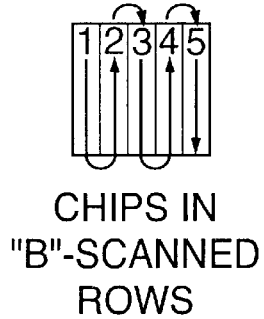
FIG. 3 is a plan view showing an alternative sequence scheme for exposing chips on a wafer and stripes within each chip, according to Example Embodiment 2.
Figure 3:
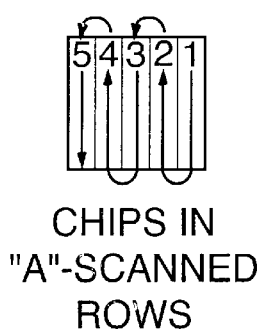
Figure 3:
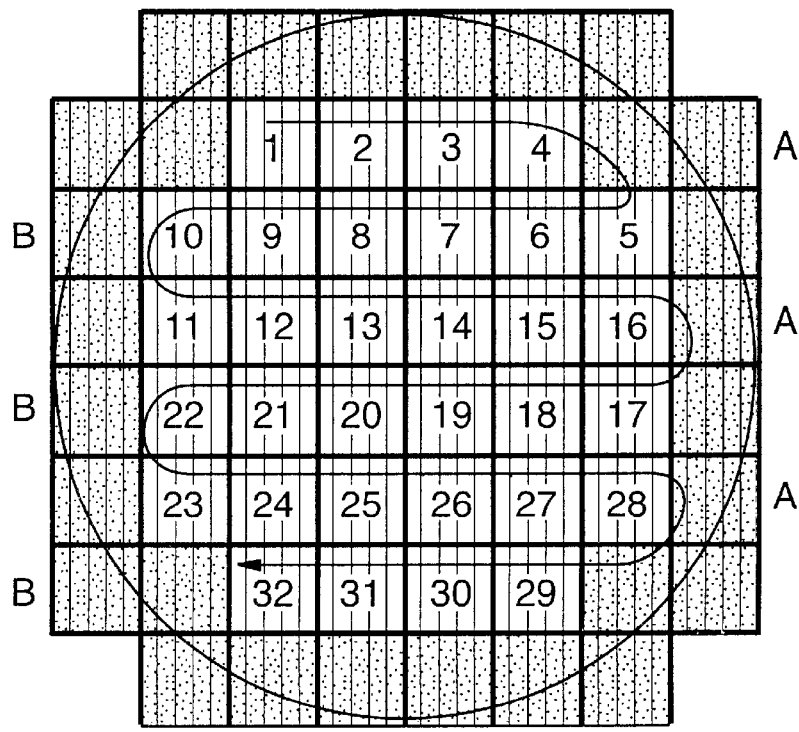

In an alternative embodiment, the stripe-exposure sequence is reversed (i.e., from left-to-right to right-to-left) for the chips in alternating rows on the wafer, while reversing the direction of the chip-exposure sequence on the wafer in alternating rows in the ordinary manner, as shown in FIG. 3. With this alternative scheme, the canceling effect is achieved while reducing unnecessary movement of the wafer stage.

Example Embodiment 3 (Same-Direction, All Rows)

Figure 4:
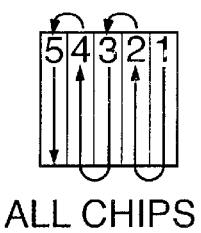
FIG. 4 is a plan view showing a sequence scheme for exposing chips on a wafer and stripes within each chip, according to Example Embodiment 3.
Figure 4:
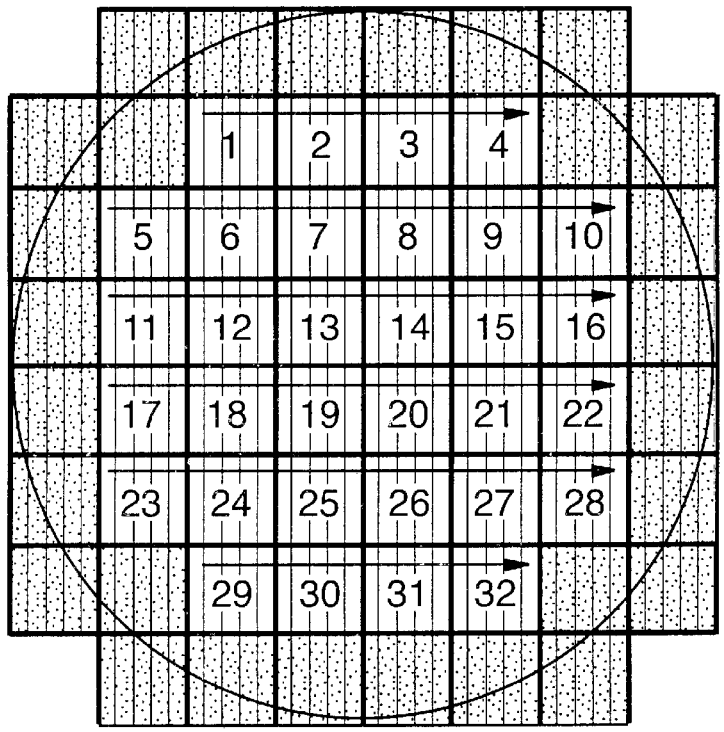

This example embodiment is depicted in FIG. 4. As in Example Embodiment 1, fragmentary chips are exposed after exposing the functional-device chips.

With respect to the functional-device chips, the direction of the exposure sequence is the same for all rows of such chips, and the exposure sequence for the stripes of the functional-device chip is the same for all chips. Furthermore, the direction (left-to-right in the figure) of the exposure sequence for stripes is the same as the direction of the exposure sequence for functional-device chips.

Adoption of the exposure sequence of this example embodiment does not result in as complete a cancellation of thermal expansion forces as achieved by Example Embodiment 2. In this embodiment, the direction of thermal expansion of the wafer is fixed in the direction of the exposure sequence (toward the right in the figure). Nevertheless, predicting the magnitude of expansion of the wafer during exposure is easy in this instance. Since the direction of thermal expansion is fixed in one direction, thermal expansion can be predicted adequately by regarding the magnitude of thermal expansion as proportional to a quantity determined from the resist sensitivity and the pattern-element-area ratio of the pattern. Hence, it is unnecessary to determine the direction and magnitude of wafer expansion using complex calculations (rather, finite-element analysis can be employed). Furthermore, the effects of thermal expansion of the wafer can be reduced substantially by passing a heat-transfer gas through the channels in the surface of the wafer chuck, as described above.

In a specific example, using finite-element analysis, in an instance in which the resist sensitivity was 5 $\mu C/cm^2$, almost no difference in maximum shot-position error was observed in this example embodiment compared to Example Embodiment 1 (both embodiments exhibited a maximum shot-position error of approximately 10 nm). In the present example embodiment, however, since the direction of positional deviation of shot position is fixed for all functional-device chips, the positional deviation can be predicted using a simple quantitative expression. Based on the calculated positional deviation, the shot position of each functional-device chip can be corrected as required to yield a shot-position error of 5 nm or less. This correction can be achieved using the image-position-adjustment deflectors in the projection-optical system.

Example Embodiment 4 (End Rows First)

Figure 5:
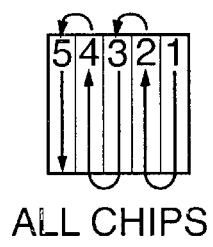
FIG. 5 is a plan view showing a sequence scheme for exposing chips on a wafer and stripes within each chip, according to Example Embodiment 4.
Figure 5:
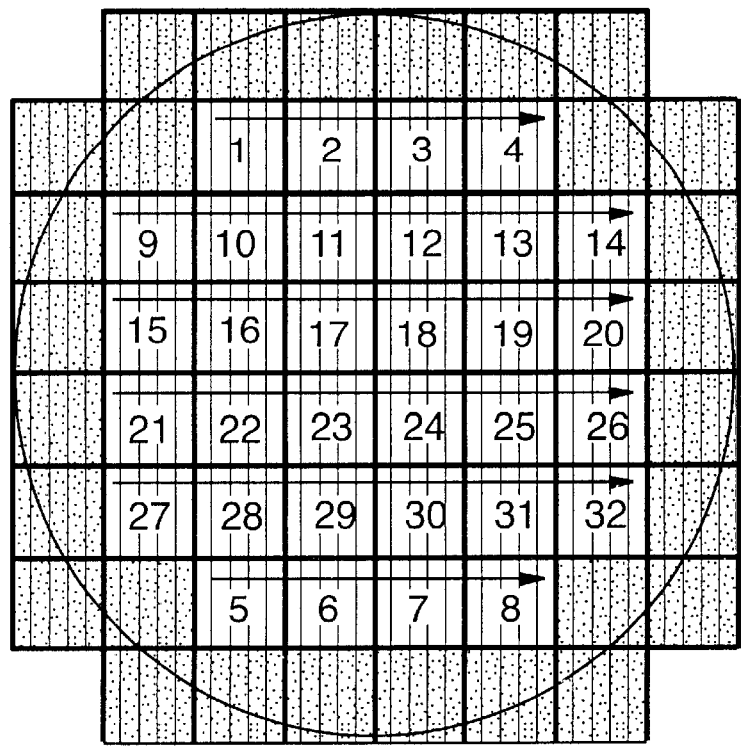

This example embodiment is depicted in FIG. 5. As in Example Embodiment 1, fragmentary chips are exposed after the functional-device chips.

According to finite-element analysis, in an exposure scheme according to Example Embodiment 2 (in which sequential exposure is advanced from top to bottom without skipping any rows of chips), the maximum shot-position error is produced in peripheral areas of the chips that are exposed last. This is attributed to the effects of heat accumulating in the wafer as exposure proceeds.

In the present embodiment, the uppermost row of functional-device chips is exposed first, followed by the lowermost row of functional-device chips (in Example Embodiment 2, the lowermost row was exposed last). Then, the four center rows of functional-device chips are exposed in sequence, as in Example Embodiment 2. As a result of this exposure scheme, the forces of thermal expansion of the wafer cancel each other out in the vertical direction of the figure, resulting in a decreased accumulation of heat in the last row of functional-device chips. This is because heat accumulated in the lowermost row, during exposure of that row, diffuses outward while the central rows are being exposed in a downward sequence. In addition, shot-position error is reduced further by mounting the wafer on a wafer chuck employing circulation of a heat-transfer gas, as described above.

In a specific example, finite-element analysis (with the resist sensitivity being 5 $\mu C/cm^2$) revealed a shot-position error of approximately 6.5 nm obtained with this embodiment (compared to a maximum shot-position error of approximately 7 nm obtained with Example Embodiment 2).

Example Embodiment 5 (Spiral Sequence)

Figure 6:
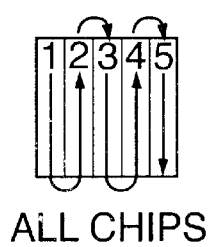
FIG. 6 is a plan view showing a sequence scheme for exposing chips on a wafer and stripes within each chip, according to Example Embodiment 5.
Figure 6:
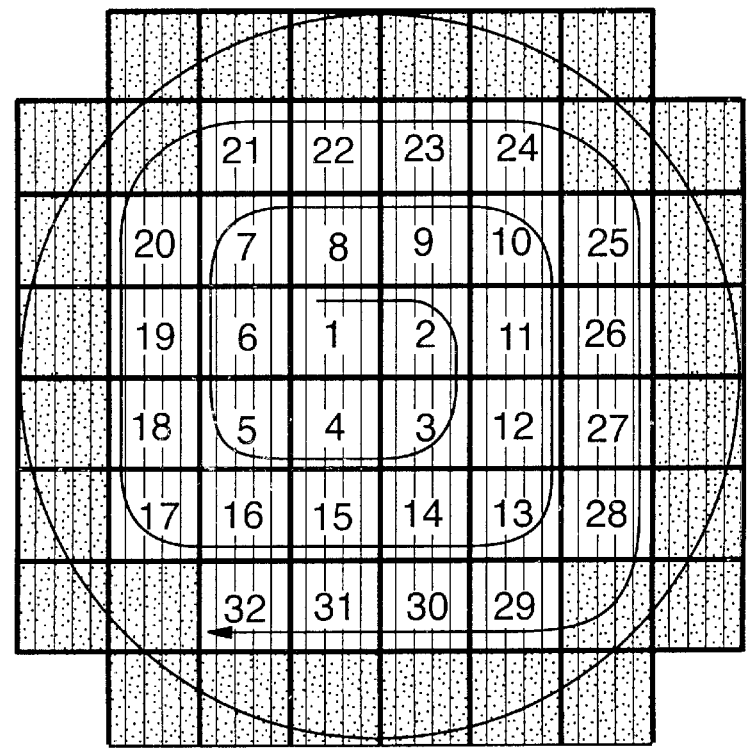

This example embodiment is depicted in FIG. 6. As in Example Embodiment 1, fragmentary chips are exposed after the functional-device chips.

Exposure of functional-device chips begins in the center of the wafer and progresses to the outer regions of the chip in a spiral manner. As a result, as exposure of the functional-device chips progresses, thermal expansion of the wafer progresses radially outward such that the center of the wafer experiences no displacement whatsoever. Furthermore, since rows and columns of functional-device chips that are relatively distant from each other on the outer regions of the wafer are exposed, the rows and columns have little thermal effect on each other.

Example Embodiment 6 (Spiral Sequence)

Figure 7:
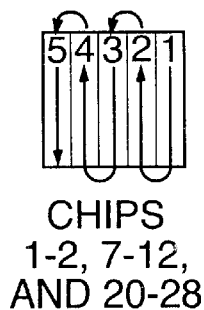
FIG. 7 is a plan view showing a sequence scheme for exposing chips on a wafer and stripes within each chip, according to Example Embodiment 6.
Figure 7:
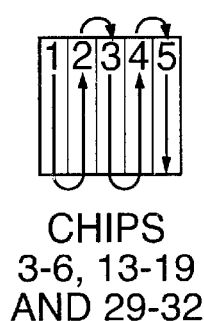
Figure 7:
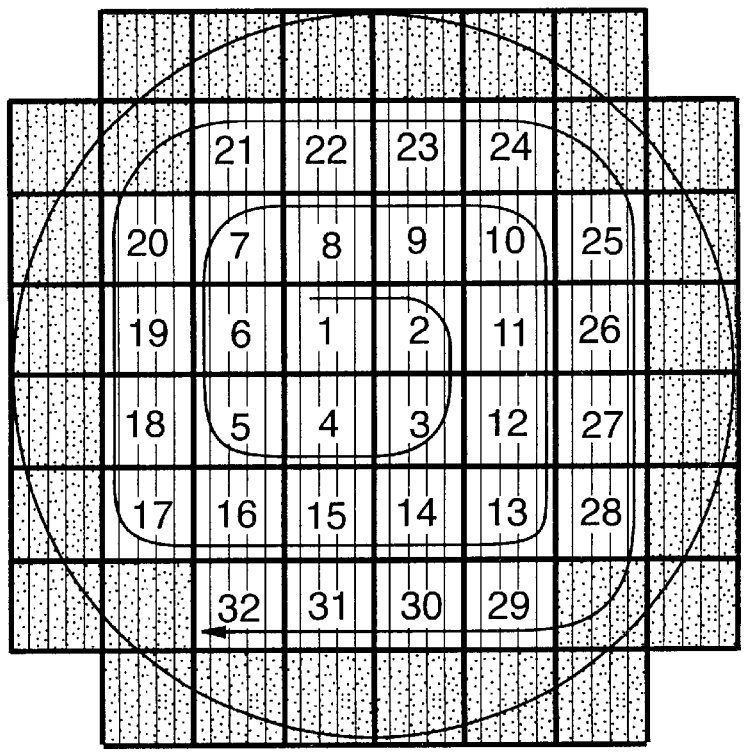

This example embodiment is depicted in FIG. 7. As in Example Embodiment 1, fragmentary chips are exposed after the functional-device chips.

In this embodiment, in addition to the inside-to-outside spiral exposure sequence of functional-device chips described in Example Embodiment 5, the stripe-exposure sequence (i.e., left-to-right versus right-to-left) in individual functional device chips changes as shown. I.e., the stripe-exposure sequence (left-to-right) for certain functional-device chips is opposite the stripe-exposure sequence (right-to-left) for other functional-device chips.

Example Embodiment 7 (Spiral Sequence)

Figure 8:
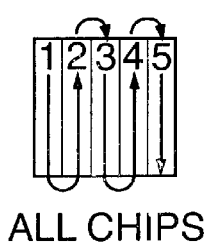
FIG. 8 is a plan view showing a sequence scheme for exposing chips on a wafer and stripes within each chip, according to Example Embodiment 7.
Figure 8:
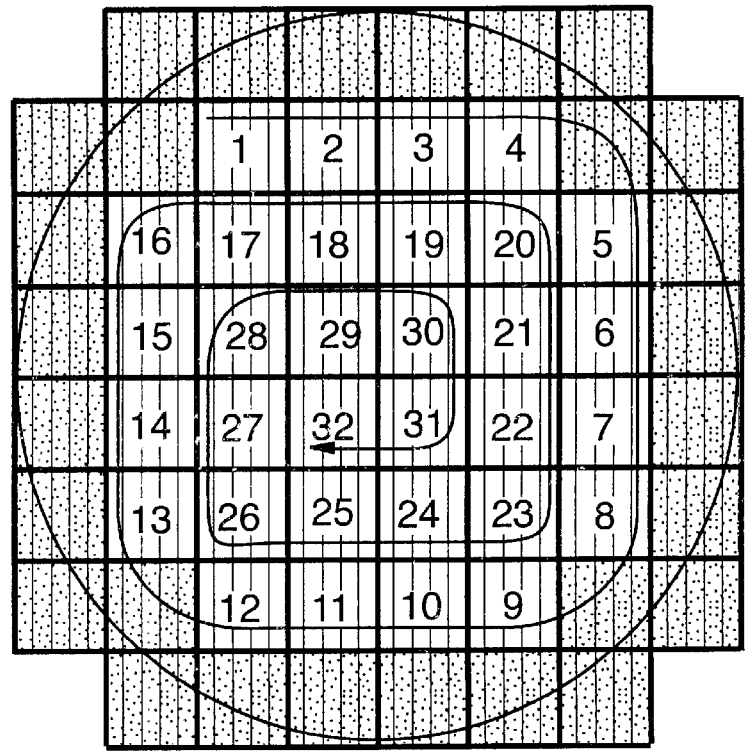

This example embodiment is depicted in FIG. 8. As in Example Embodiment 1, fragmentary chips are exposed after the functional-device chips.

In this embodiment, exposure of functional-device chips is performed in a spiral sequence, progressing from outer chips to inner chips. During the exposure of the outer chips located near the periphery of the wafer, thermal-expansion displacements are concentrated toward the center from respective directions. As a result, the various individual displacements tend to cancel each other in the central region of the wafer.

Example Embodiment 8 (Spiral Sequence)

Figure 9:
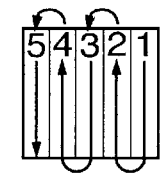
FIG. 9 is a plan view showing a sequence scheme for exposing chips on a wafer and stripes within each chip, according to Example Embodiment 8.
Figure 9:
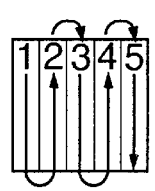
Figure 9:
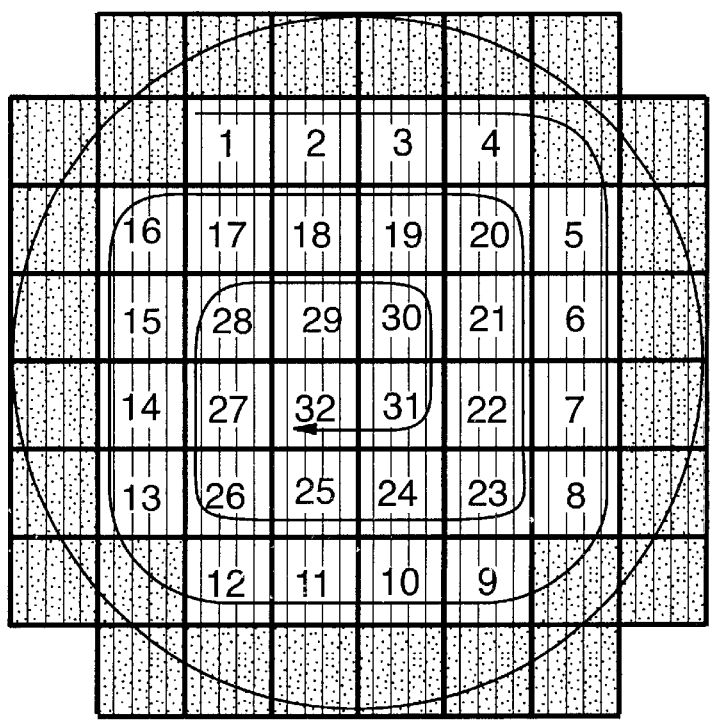

This example embodiment is depicted in FIG. 9. As in Example Embodiment 1, fragmentary chips are exposed after the functional-device chips.

This embodiment includes the spiral scheme of exposure of functional-device chips, beginning from the outside and progressing spirally inward to the center of the wafer, as described in Example Embodiment 7. This embodiment also includes changing the stripe-exposure sequence (i.e., left-to-right versus right-to-left) in individual functional-device chips, as shown. I.e., the stripe-exposure sequence for certain functional-device chips is opposite the stripe-exposure sequence for other functional-device chips.

Example Embodiment 9 (Spiral Sequence)

Figure 10:
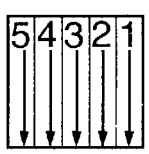
FIG. 10 is a plan view showing a sequence scheme for exposing chips on a wafer and stripes within each chip, according to Example Embodiment 9.
Figure 10:
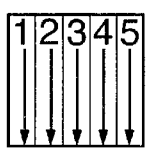
Figure 10:
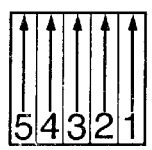
Figure 10:
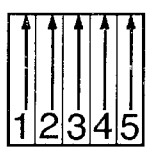
Figure 10:
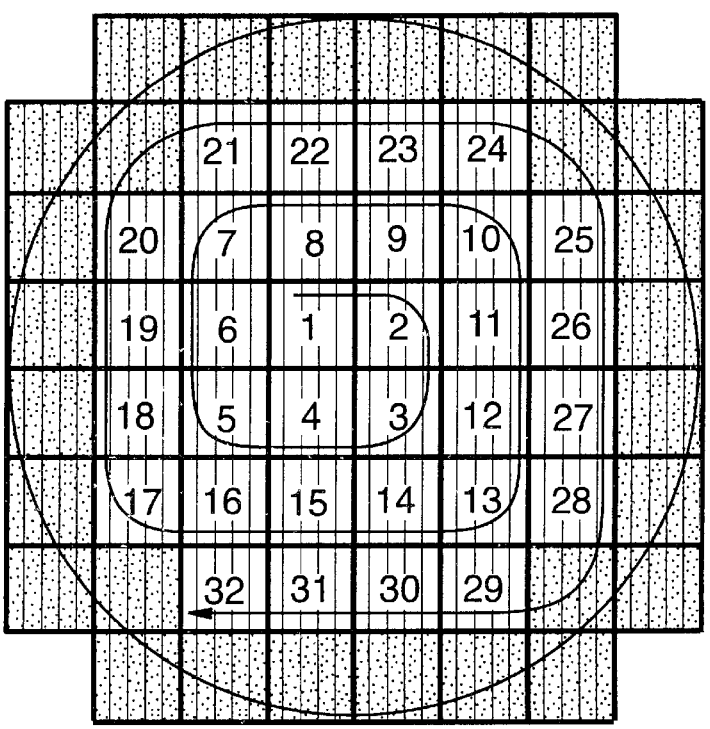

This example embodiment is depicted in FIG. 10. As in Example Embodiment 1, fragmentary chips are exposed after the functional-device chips.

This embodiment includes the inside-to-outside spiral scheme of exposure of functional-device chips described in Example Embodiment 5. This embodiment also includes changing the stripe-exposure sequence and direction in individual functional-device chips, as shown. Not only does the stripe-exposure sequence change (i.e., left-to-right versus right-to-left), but also the scan direction changes (i.e., top-to-bottom versus bottom-to-top). For example, in chip 32, exposure begins with the left-most stripe. As result, the right-hand regions of that chip are displaced to the right during exposure of the chip, canceling the leftward thermal expansion from exposure of the preceding chip. In chip 31, each stripe is exposed bottom-to-top. As a result, the upper regions of the stripes are displaced upward during exposure of the chip, canceling the downward thermal expansion from exposure of the preceding chip.

Example Embodiment 10 (Spiral Sequence)

Figure 11:
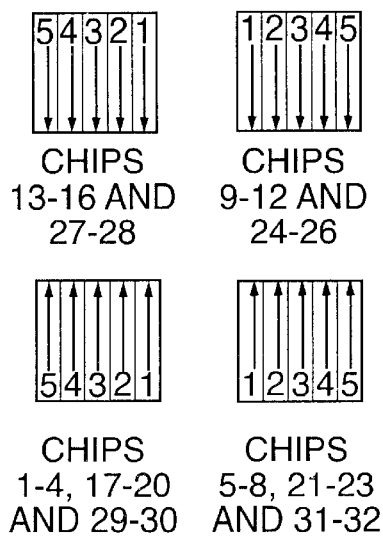
FIG. 11 is a plan view showing a sequence scheme for exposing chips on a wafer and stripes within each chip, according to Example Embodiment 10.
Figure 11:
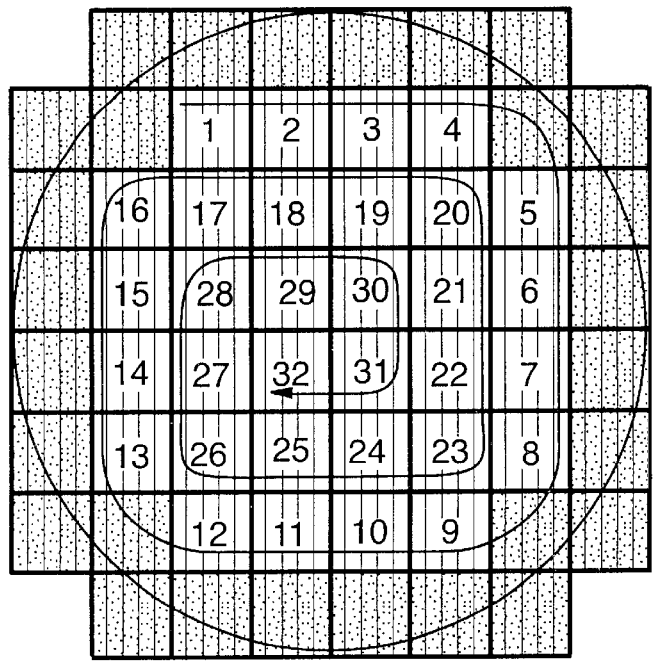

This example embodiment is depicted in FIG. 11. As in Example Embodiment 1, fragmentary chips are exposed after the functional-device chips.

This example embodiment employs the spiral scheme of exposure for functional-device chips, as described in Example Embodiment 8. However, exposure of the stripes in specific functional-device chips changes as noted.

Example Embodiment 11 (Skip One Row)

Figure 12:
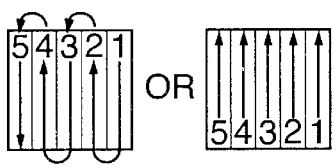
FIG. 12 is a plan view showing a sequence scheme for exposing chips on a wafer and stripes within each chip, according to Example Embodiment 11.
Figure 12:
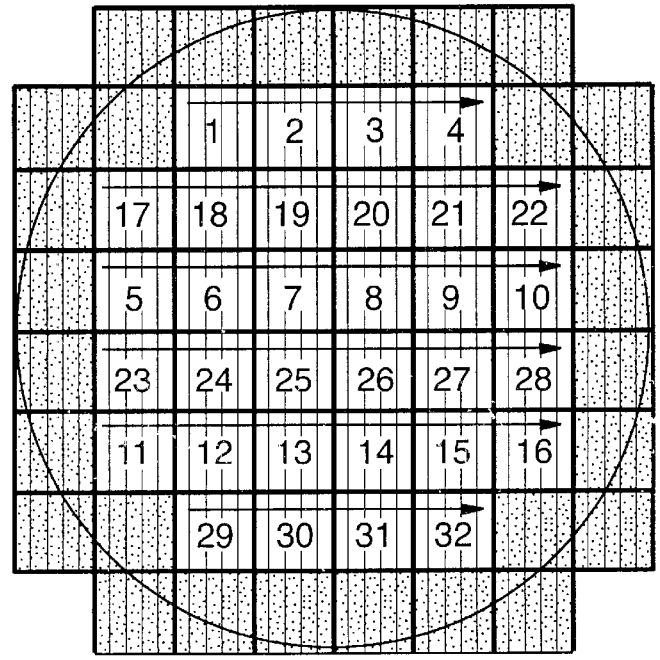

This example embodiment is depicted in FIG. 12. As in Example Embodiment 1, fragmentary chips are exposed after the functional-device chips.

In this example embodiment, exposure of each row of functional-device chips occurs from left-to-right in the figure, with skipping of a row as exposure proceeds to the next row. Specifically, the uppermost row is exposed first. Then, the second row is skipped to expose the third row. Then, the fourth row is skipped to expose the fifth row. Exposure then proceeds to the second, fourth, and sixth rows, in sequence. The stripe-exposure sequence within each functional-device chip can be serpentine or unidirectional as shown. The exposure scheme of this embodiment disperses the heating of the wafer.

Example Embodiment 12 (Skip One Row)

Figure 13:
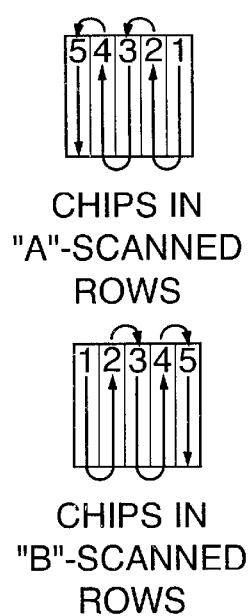
FIG. 13 is a plan view showing a sequence scheme for exposing chips on a wafer and stripes within each chip, according to Example Embodiment 12.
Figure 13:
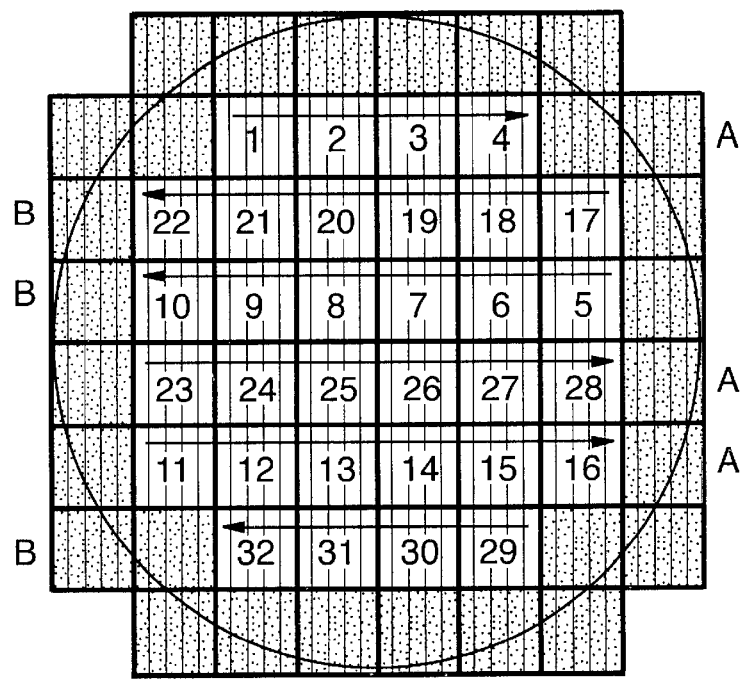

This example embodiment is depicted in FIG. 13. As in Example Embodiment 1, fragmentary chips are exposed after the functional-device chips.

In this embodiment, in addition to the skipping of rows, the direction of exposure of the chips in each row is reversed. Furthermore, in this embodiment, the stripe-exposure sequence (right-to-left versus left-to-right) changes, depending upon the direction of exposure of functional-device chips in a particular row. This scheme requires less movement of the wafer stage to expose the wafer than in Example Embodiment 11.

Example Embodiment 13 (Skip Two Rows)

Figure 14:
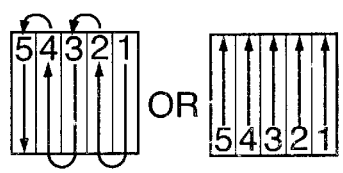
FIG. 14 is a plan view showing a sequence scheme for exposing chips on a wafer and stripes within each chip, according to Example Embodiment 13.
Figure 14:
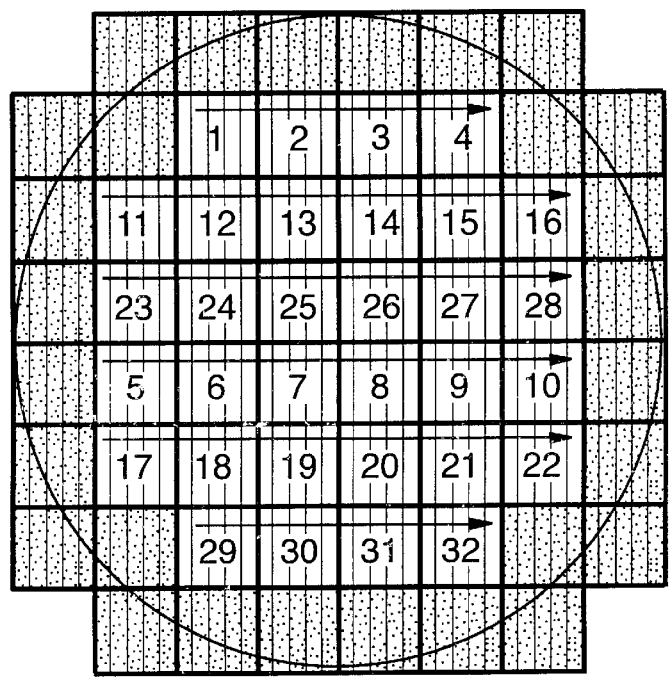

This example embodiment is depicted in FIG. 14. As in Example Embodiment 1, fragmentary chips are exposed after the functional-device chips.

In this embodiment, exposure of functional-device chips in each row is performed in the same direction. However, two rows are skipped from the just-exposed row to the row to be exposed next.

Example Embodiment 14 (Skip Two Rows)

Figure 15:
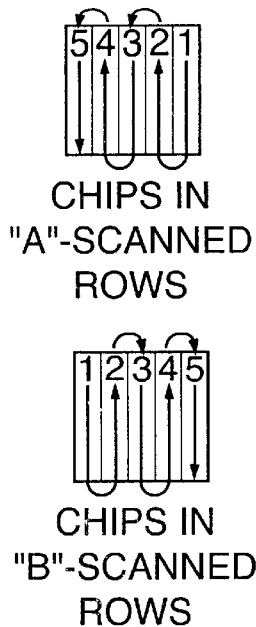
FIG. 15 is a plan view showing a sequence scheme for exposing chips on a wafer and stripes within each chip, according to Example Embodiment 14.
Figure 15:
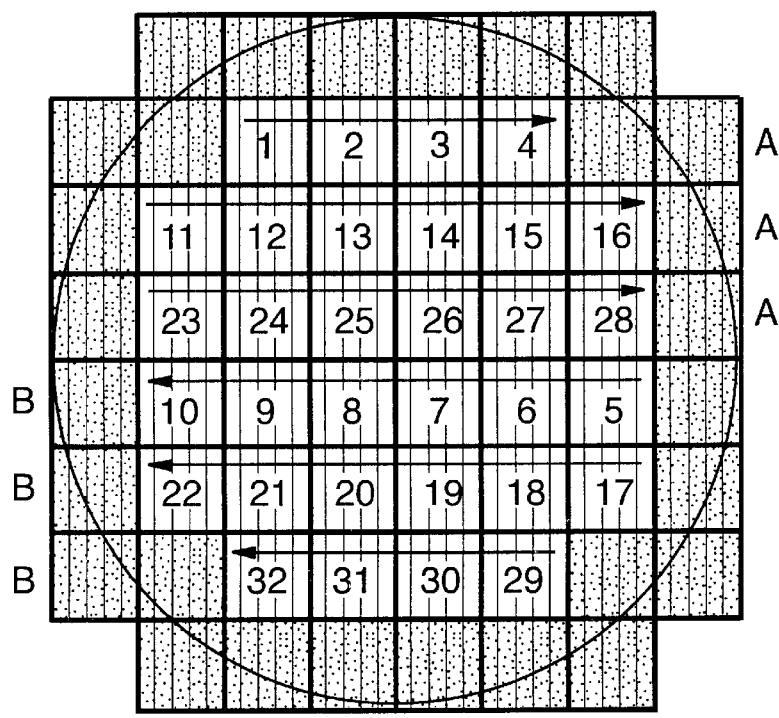

This example embodiment is depicted in FIG. 15. As in Example Embodiment 1, fragmentary chips are exposed after the functional-device chips.

In this embodiment, two rows are skipped from the just-exposed row to the row to be exposed next, as in Example Embodiment 13. In addition, as each row comes up for exposure, the exposure direction is reversed. Furthermore, the stripe-exposure sequence changes (i.e., right-to-left versus left-to-right) with each change in chip-exposure direction.

Example Embodiment 15 (Skip Adjacent Chips)

Figure 16:
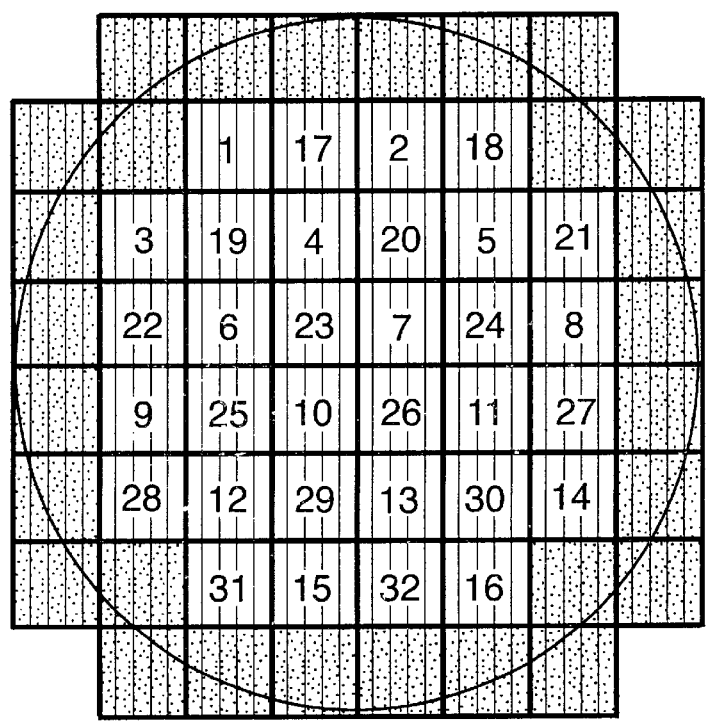
FIG. 16 is a plan view showing a sequence scheme for exposing chips on a wafer and stripes within each chip, according to Example Embodiment 15.

This example embodiment is depicted in FIG. 16. As in Example Embodiment 1, fragmentary chips are exposed after the functional-device chips.

In this embodiment, adjacent functional-device chips in a particular row being exposed are skipped as exposure proceeds. As a result, the positions at which the wafer is heated are dispersed.

Example Embodiment 16 (Random)

Figure 17:
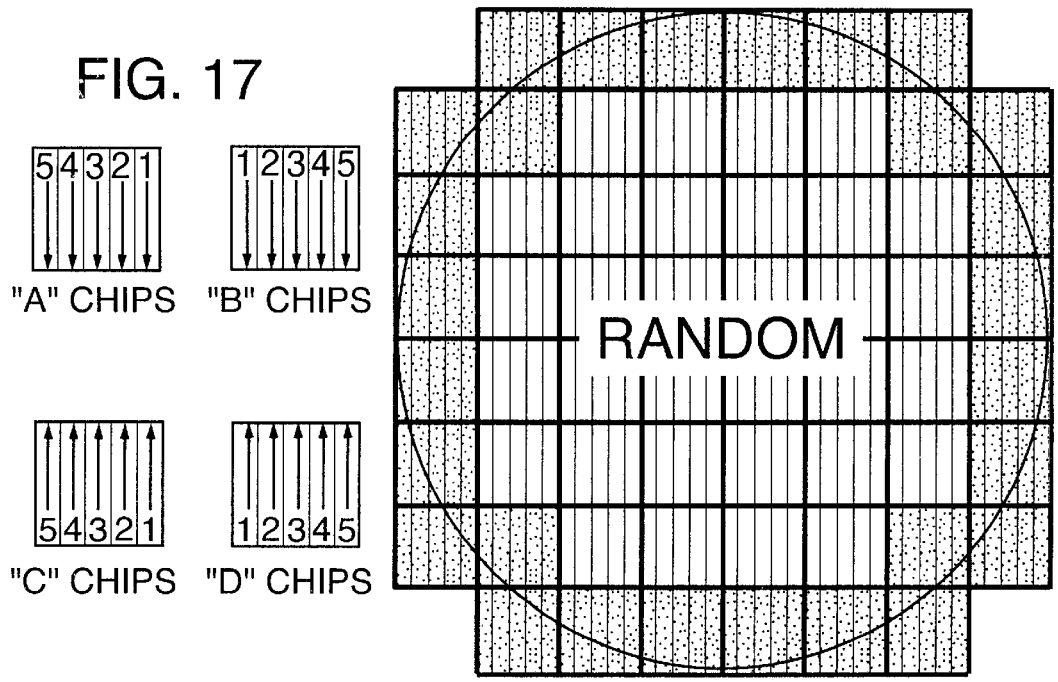
FIG. 17 is a plan view showing a sequence scheme for exposing chips on a wafer and stripes within each chip, according to Example Embodiment 16.
Figure 18:
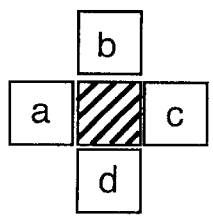
FIG. 18 schematically depicts a scheme, according to Example Embodiment 16, for selecting a particular sequence for exposing the stripes of a particular chip.
Figure 18:
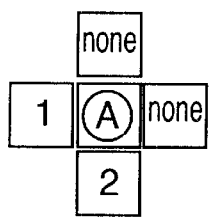
Figure 18:
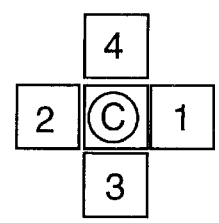
Figure 18:
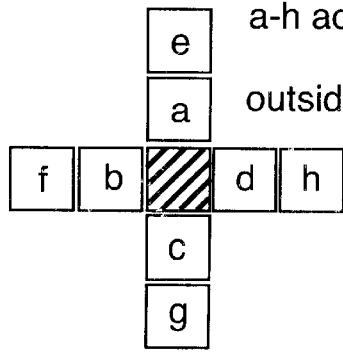

This example embodiment is depicted in FIGS. 17 and 18. As in Example Embodiment 1, fragmentary chips are exposed after the functional-device chips.

In this embodiment, individual functional-device chips are exposed in a random order. The stripe-exposure sequence for the to-be-exposed chip is selected (among four choices) by considering the chips adjacent the chip to be exposed. I.e., consideration is given to whether any of the neighboring chips already have been exposed, the order in which the adjacent chips were exposed, and the stripe-exposure sequence used in the neighboring exposed chips.

More specifically, on a wafer, the first chip to be exposed is determined randomly, and the stripe-exposure sequence for that chip can be any of A–D shown in FIG. 17. Then, a second chip is selected randomly. If the second chip is not neighboring the first-exposed chip, then the stripe-exposure sequence for the second chip can be any of A–D in FIG. 17. But, if the second chip neighbors a chip already exposed, then the stripe-exposure sequence selected for the second chip is selected with consideration given for the stripe-exposure sequence of the exposed neighboring chip. Referring to the top portion of FIG. 18, if chip "a" already is exposed (by stripe-exposure sequence A in FIG. 17), then for the next chip the opposite stripe-exposure sequence is selected, namely sequence C in FIG. 17.

After many chips have been exposed on the wafer, then the next randomly selected chip to be exposed likely will be adjacent multiple already-exposed chips. In such an instance, of the neighboring exposed chips, the greatest consideration is given for the most recently exposed neighboring chip, then to the next-to-latest-exposed chip. Referring to the left-middle portion of FIG. 18, let the latest-exposed neighboring chip be chip "2" and the next-to-latestexposed chip be chip "1". Based on chip "2" being situated below the chip to be exposed, the candidate stripe-exposure sequences for the chip to be exposed are A and B in FIG. 17. Based on chip "1" being situated to the left of the chip to be exposed, the candidate stripe-exposure sequences for the chip to be exposed are A and C in FIG. 17. From these choices, stripe-exposure sequence A is selected for the to-be-exposed chip.

Consider now a situation in which all the neighboring chips already have been exposed, as shown in the right-middle portion of FIG. 18, in which chip "4" was the most recently exposed neighboring chip, chip "3" was the next-earliest, chip "2" was even earlier, and chip "1" was the earliest-exposed of all the neighboring chips. In this example, based on chip "4" being situated above the to-be-exposed chip, the candidate stripe-exposure sequences for the to-be-exposed chip are C and D in FIG. 17. Based on chip "3" being situated below the to-be-exposed chip, the candidate stripe-exposure sequences are A or B. (But these schemes are contradictory to schemes C and D, so chip "4" has priority.) Based on chip "2" being situated to the left of the to-be-exposed chip, the candidate stripe-exposure sequences are A and C. From these choices, stripe-exposure C is selected for the to-be-exposed chip.

Therefore, the adjacent chip that was exposed most recently has the largest thermal influence on the to-be-exposed chip, and hence is given the most "weight" in the determination of the stripe-exposure sequence for the to-be-exposed chip. The stripe-exposure sequence that is selected for the to-be-exposed chip achieves the greatest suppression of thermal expansion due to the previous exposure.

Referring to the lower portion of FIG. 18, the determination of the stripe-exposure sequence for the to-be-exposed chip also can take into account chips that are adjacent immediately neighboring chips. In this scheme, the more distant chips are considered with lighter weighting coefficients applied to them.

Example Embodiment 17 (Same Direction, All Columns)

Figure 19:
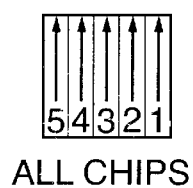
FIG. 19 is a plan view showing a sequence scheme for exposing chips on a wafer and stripes within each chip, according to Example Embodiment 17.

This embodiment is depicted in FIG. 19. As in Example Embodiment 1, fragmentary chips are exposed after the functional-device chips.

In this embodiment, longitudinal columns of chips are exposed from top to bottom. In each chip, the stripes are exposed from bottom to top in the figure.

Example Embodiment 18 (Vertical Serpentine)

Figure 20:
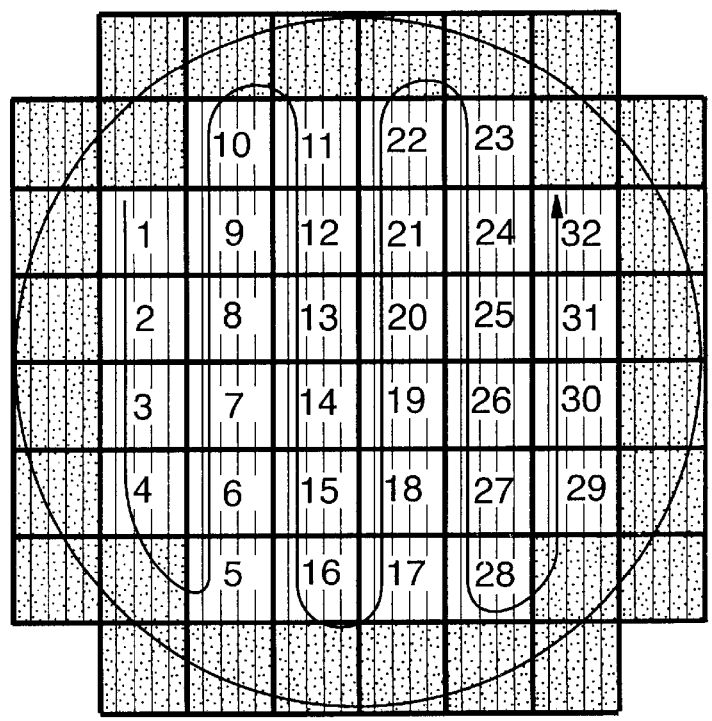
FIG. 20 is a plan view showing a sequence scheme for exposing chips on a wafer and stripes within each chip, according to Example Embodiment 18.

This example embodiment is depicted in FIG. 20. As in Example Embodiment 1, fragmentary chips are exposed after the functional-device chips.

In this example, the exposure orders for the functional-device chips are arranged in vertical columns. The direction of exposure of the chips in each column is reversed. Also, in a given chip, the stripe-exposure direction is opposite the direction of exposure in the respective column.

Example Embodiment 19 (Skip One Column)

Figure 21:
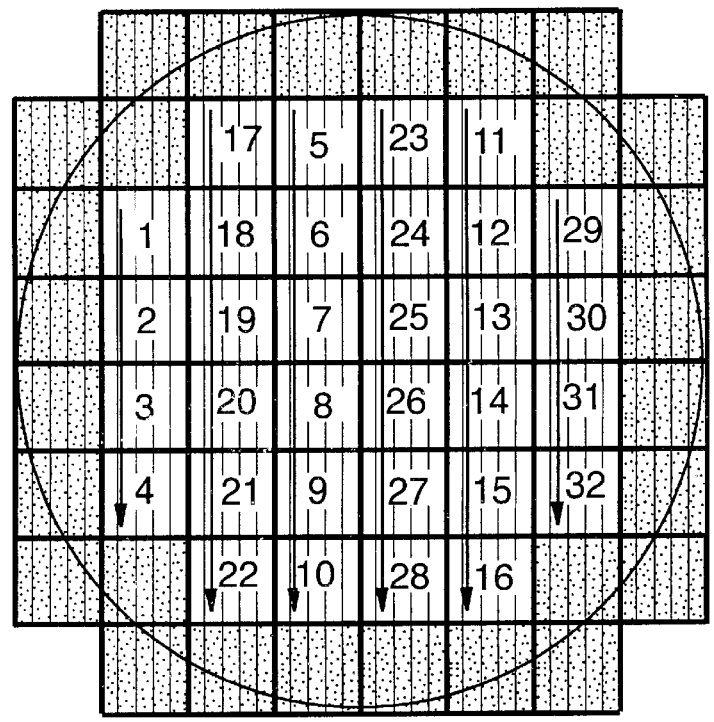
FIG. 21 is a plan view showing a sequence scheme for exposing chips on a wafer and stripes within each chip, according to Example Embodiment 19.

This example embodiment is depicted in FIG. 21. As in Example Embodiment 1, fragmentary chips are exposed after the functional-device chips.

In this example embodiment, exposure of each column of functional-device chips occurs from up-to-down in the figure, with skipping of a column as exposure proceeds to the next column. Specifically, the left-most column is exposed first. Then, the second column is skipped to expose the third column. Then, the fourth column is skipped to expose the fifth column. Exposure then proceeds to the second, fourth, and sixth columns, in sequence.

Example Embodiment 20 (Skip One Column)

Figure 22:
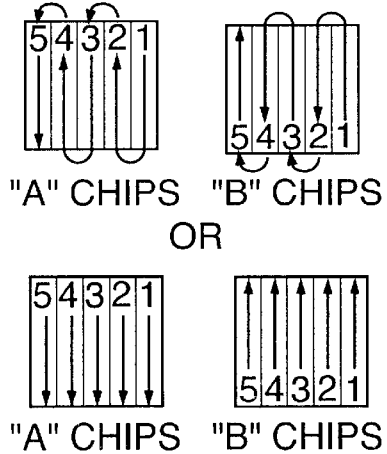
FIG. 22 is a plan view showing a sequence scheme for exposing chips on a wafer and stripes within each chip, according to Example Embodiment 20.
Figure 22:
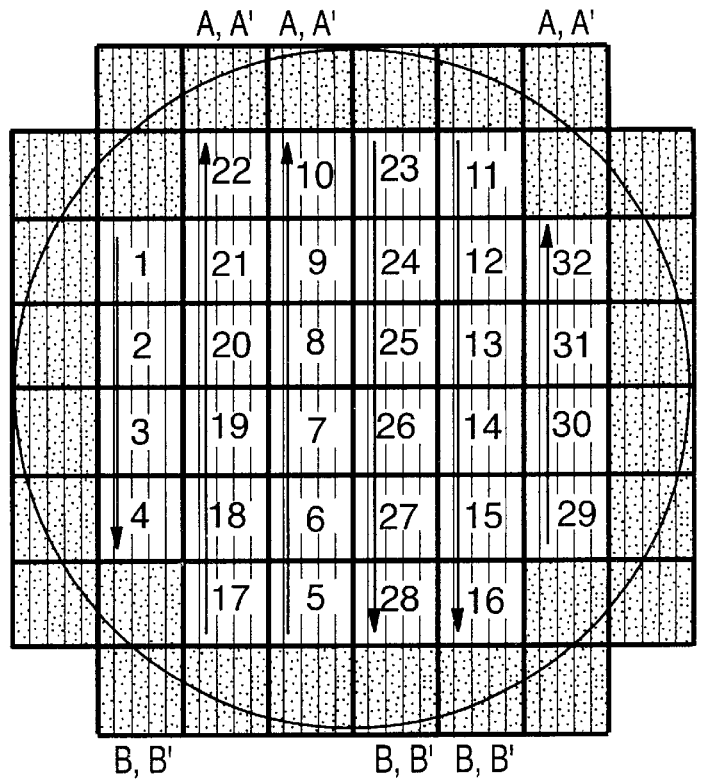

This example embodiment is depicted in FIG. 22. As in Example Embodiment 1, fragmentary chips are exposed functional-device chips.

This embodiment is similar to Example Embodiment 19, except that, upon beginning exposure of a new column, the vertical sequence direction is the opposite of the vertical sequence direction of the just-exposed column. In each chip, the scheme for exposing the constituent stripes is selected from A, B and A', B', according to the vertical sequence direction of the respective column.

Example Embodiment 21 (Skip Two Columns)

Figure 23:
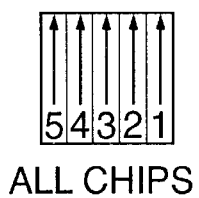
FIG. 23 is a plan view showing a sequence scheme for exposing chips on a wafer and stripes within each chip, according to Example Embodiment 21.
Figure 23:
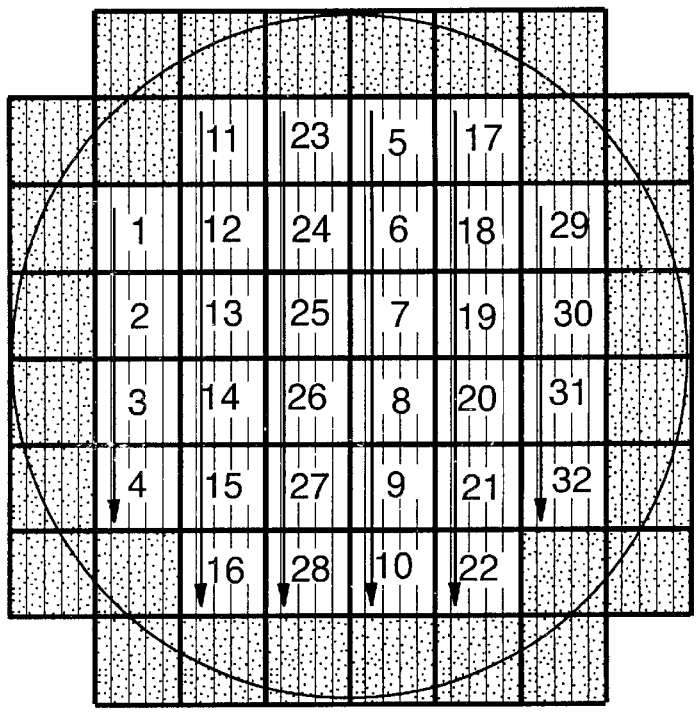

This example embodiment is depicted in FIG. 23. As in Example Embodiment 1, fragmentary chips are exposed after the functional-device chips.

In this embodiment, exposure of functional-device chips in each column is performed in the same direction. However, two columns are skipped from the just-exposed column to the column to be exposed next.

Example Embodiment 22 (Skip Two Columns)

Figure 24:
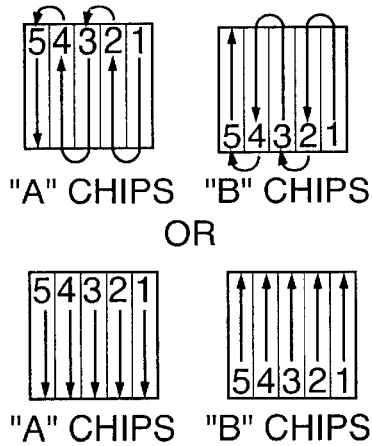
FIG. 24 is a plan view showing a sequence scheme for exposing chips on a wafer and stripes within each chip, according to Example Embodiment 22.
Figure 24:
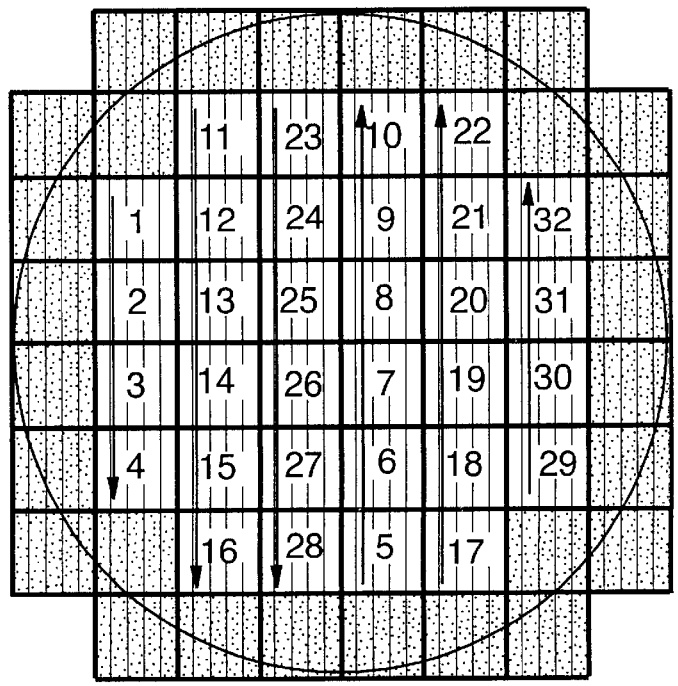

This example embodiment is depicted in FIG. 24. As in Example Embodiment 1, fragmentary chips are exposed after the functional-device chips.

In this embodiment, two columns are skipped from the just-exposed column to the column to be exposed next, as in Example Embodiment 21. In addition, as each column comes up for exposure, the exposure direction is reversed. Furthermore, the stripe-exposure sequence changes (i.e., serpentine beginning upper right to serpentine beginning lower right, or up-to-down beginning on right to down-to-up beginning on right) with each change in chip-exposure direction.

Example Embodiment 23 (End Columns First)

Figure 25:
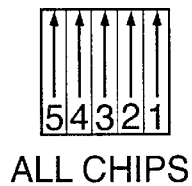
FIG. 25 is a plan view showing a sequence scheme for exposing chips on a wafer and stripes within each chip, according to Example Embodiment 23.
Figure 25:
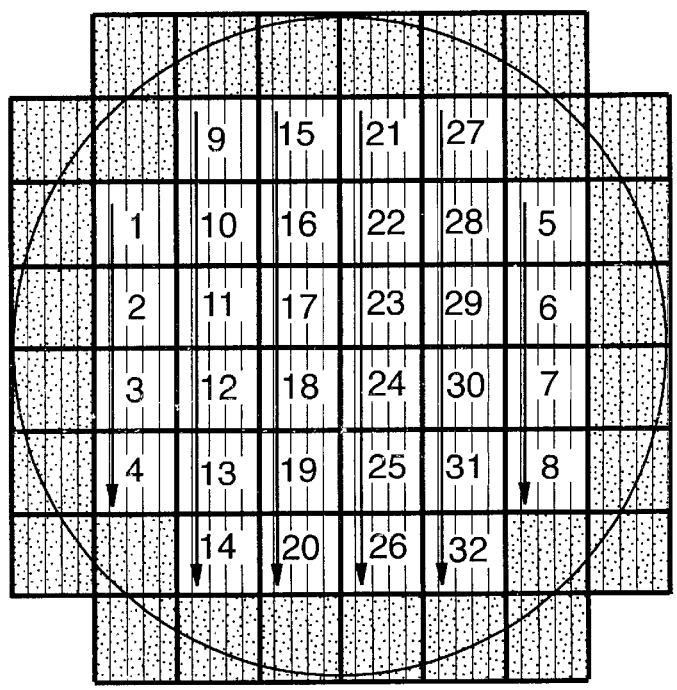

This example embodiment is depicted in FIG. 25. As in Example Embodiment 1, fragmentary chips are exposed after the functional-device chips.

In the present embodiment, the left-most column of functional-device chips is exposed first, followed by the right-most column. Then, the four center columns are exposed in sequence.

Microelectronic-Device Manufacturing Method

Figure 30:
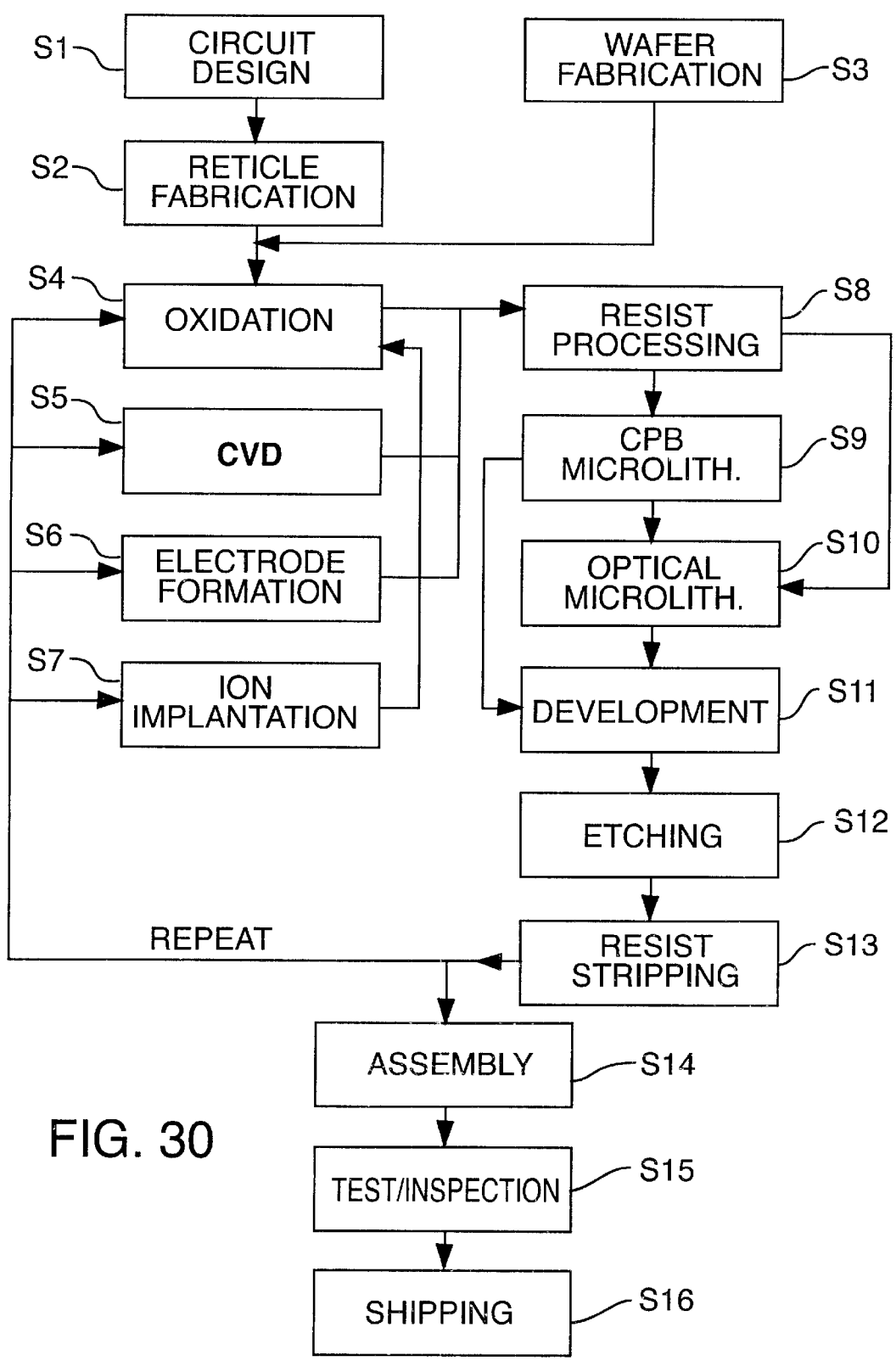
FIG. 30 is a process flow chart of a representative process for fabricating a microelectronic device.

FIG. 30 is a flow chart of steps in a process for manufacturing a microelectronic device such as a semiconductor chip (e.g., a integrated circuit or LSI device), a display panel (e.g., liquid-crystal panel), a charge-coupled device (CCD), a thin-film magnetic head, or a micro-machine, for example. In step S1, the circuit for the device is designed. In step S2, a reticle ("mask") for the circuit is manufactured. At this time, local resizing of pattern elements may be performed to correct for proximity effects and for beam blur due to space-charge effects. In step S3, a substrate ("wafer") is manufactured from a material such as silicon.

Steps S4–S13 are directed to wafer-processing steps, specifically "pre-process" steps. In the pre-process steps, the circuit pattern defined on the reticle is transferred onto the wafer by microlithography. Step S14 is an assembly step (also termed a "post-process" step) in which the wafer that has been passed through steps S4–S13 is formed into individual device chips. This step can include, for example, assembling the devices (dicing and bonding) and packaging (encapsulation of individual chips). Step S15 is an inspection and testing step in which any of various operability, qualification, and durability tests of the devices produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of the wafer. Step S5 involves chemical-vapor deposition (CVD) for forming an insulating film on the wafer surface. Step S6 is an electrode-forming step for forming an insulating film on the wafer (typically by vapor deposition). Step S7 is an ion-implantation step for implanting ions (e.g., dopant ions) into the wafer or into a layer previously applied to the wafer. Step S8 involves application of a resist (exposure-sensitive material) to the wafer. Step S9 involves CPB microlithography (e.g., electron-beam microlithography) of the resist with the pattern defined on the reticle fabricated in step S2, to transfer a latent image of the pattern to the resist, as described elsewhere herein. A CPB microlithography apparatus such as that described above is used to perform this step. As an alternative to step S9, step S10 involves optical microlithography of the resist with the pattern defined on the reticle using an optical "stepper" or analogous device. Correction of proximity effects can be performed at either of steps S9 or S10. Step S11 involves developing the exposed resist on the wafer. Step S12 involves etching the wafer to remove material from areas where developed resist is absent. Step S13 involves resist separation, in which remaining resist on the wafer is removed ("stripped") after the etching step. By repeating steps S4–S13, circuit patterns as defined by successive reticles are formed superposedly on the wafer.

Whereas the invention has been described in connection with multiple example embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a microlithography method in which a die pattern, defined on a segmented reticle including multiple stripes defining respective portions of the pattern, is projection-transferred stripe-by-stripe to a chip region on a sensitive surface of a substrate using a charged particle beam, a method for reducing thermal expansion of the substrate during exposure, comprising:
   (a) determining a magnitude of thermal expansion of the substrate that would occur if a chip region on the substrate were exposed with the stripes in a first stripe-exposure sequence;
   (b) determining a magnitude of thermal expansion of the substrate that would occur if the chip region were exposed with the stripes in a second stripe-exposure sequence different from the first stripe-exposure sequence; and
   (c) if the magnitude of thermal expansion determined in step (b) is lower than the magnitude of thermal expansion determined in step (a), then exposing the chip region using the second stripe-exposure sequence.

2. The method of claim 1, further comprising the steps:
   exposing the die pattern first to chip regions located fully on the sensitive surface; and
   after exposing the chip regions located fully on the sensitive surface, exposing the die pattern to chip regions extending partially off the sensitive surface.

3. The method of claim 1, wherein:
   the chip regions on the sensitive surface are exposed individually in a chip-exposure sequence; and
   the chip-exposure sequence is opposite the second stripe-exposure sequence, so as to mutually cancel forces of thermal expansion of the substrate.

4. The method of claim 3, further comprising the steps:
   exposing the die pattern first to chip regions located fully on the sensitive surface; and
   after exposing the chip regions located fully on the sensitive surface, exposing the die pattern to chip regions extending partially off the sensitive surface.

5. The method of claim 1, wherein:
   the chip regions on the sensitive surface are exposed individually in a chip-exposure sequence in a fixed direction on the sensitive surface; and
   the stripe-exposure sequence has a direction identical to the fixed direction.

6. The method of claim 5, further comprising the steps:
   exposing the die pattern first to chip regions located fully on the sensitive surface; and
   after exposing the chip regions located fully on the sensitive surface, exposing the die pattern to chip regions extending partially off the sensitive surface.

7. The method of claim 1, wherein chip regions on the sensitive surface in which thermal expansion is determined to be greater are exposed before chip regions in which thermal expansion is determined to be less.

8. The method of claim 7, further comprising the steps:
   exposing the die pattern first to chip regions located fully on the sensitive surface; and
   after exposing the chip regions located fully on the sensitive surface, exposing the die pattern to chip regions extending partially off the sensitive surface.

9. The method of claim 1, further comprising:
   providing a wafer chuck comprising a wafer-mounting surface defining a channel for conducting a heat-transfer gas;
   mounting the substrate on the wafer chuck; and
   during exposure of the sensitive surface, passing the heat-transfer gas through the channel such that the heat-transfer gas contacts the substrate.

10. The method of claim 9, further comprising:
    providing the wafer chuck with a conduit for conducting a liquid coolant; and
    during exposure of the sensitive surface, conducting the liquid coolant through the conduit to maintain the wafer chuck at a constant temperature.

11. The method of claim 9, further comprising the steps:
    exposing the die pattern first to chip regions located fully on the sensitive surface; and
    after exposing the chip regions located fully on the sensitive surface, exposing the die pattern to chip regions extending partially off the sensitive surface.

12. The method of claim 1, further comprising:
    predicting an amount of thermal expansion of the substrate expected to occur during exposure of the substrate; and
    during exposure, applying a positional correction of the exposure on the substrate so as to mutually cancel forces of thermal expansion of the substrate and offset the predicted amount of thermal expansion.

13. The method of claim 12, further comprising the steps:
    exposing the die pattern first to chip regions located fully on the sensitive surface; and
    after exposing the chip regions located fully on the sensitive surface, exposing the die pattern to chip regions extending partially off the sensitive surface.

14. In a microlithography method in which a die pattern, defined on a segmented reticle, is projection-transferred using a charged particle beam to multiple chip regions arrayed on a sensitive surface of a substrate, a method for reducing thermal expansion of the substrate during exposure, comprising:
    exposing the die pattern first to chip regions located fully on the sensitive surface; and after exposing the chip regions located fully on the sensitive surface, exposing the die pattern to chip regions extending partially off the sensitive surface.

15. A method for microlithographically transferring a die pattern, defined on a segmented reticle including multiple stripes defining respective portions of the pattern, stripe-by-stripe onto a chip region on a sensitive surface of a substrate using a charged particle beam, comprising:
   (a) illuminating a region in a stripe of the reticle pattern using a charged particle beam;
   (b) directing the charged particle beam passing through the illuminated region to a respective region on the sensitive surface so as to form an image of the illuminated region on the respective region on the sensitive surface;
   (c) determining a magnitude of thermal expansion of the substrate that would occur if a chip region on the substrate were exposed with the stripes in a first stripe-exposure sequence;
   (d) determining a magnitude of thermal expansion of the substrate that would occur if the chip region were exposed with the stripes in a second stripe-exposure sequence different from the first stripe-exposure sequence; and
   (e) if the magnitude of thermal expansion determined in step (d) is lower than the magnitude of thermal expansion determined in step (c), then exposing the chip region using the second stripe-exposure sequence.

16. A method for microlithographically transferring a die pattern, defined on a segmented reticle including multiple stripes defining respective portions of the pattern, stripe-by-stripe onto a chip region on a sensitive surface of a substrate using a charged particle beam, comprising:
   (a) illuminating a region in a stripe of the reticle pattern using a charged particle beam;
   (b) directing the charged particle beam passing through the illuminated region to a respective region on the sensitive surface so as to form an image of the illuminated region on the respective region on the sensitive surface;
   (c) exposing the die pattern first to chip regions located fully on the sensitive surface; and
   (d) after exposing the chip regions located fully on the sensitive surface, exposing the die pattern to chip regions extending partially off the sensitive surface.

17. A microelectronic-device fabrication process, comprising the steps of:
   (a) preparing a wafer;
   (b) processing the wafer; and
   (c) assembling devices formed on the wafer during steps (a) and (b),
wherein step (b) comprises the steps of (i) applying resist to the wafer; (ii) exposing the resist; and (iii) developing the resist; and step (ii) comprises the method for microlithographically transferring a die pattern as recited in claim 15.

18. A microelectronic-device fabrication process, comprising the steps of:
   (a) preparing a wafer;
   (b) processing the wafer; and
   (c) assembling devices formed on the wafer during steps (a) and (b),
wherein step (b) comprises the steps of (i) applying resist to the wafer; (ii) exposing the resist; and (iii) developing the resist; and step (ii) comprises the method for microlithographically transferring a die pattern as recited in claim 16.

19. A microelectronic device produced by the method of claim 17.

20. A microelectronic device produced by the method of claim 18.

* * * * *